United States Patent [19]
Kinoshita et al.

[11] Patent Number: 6,115,319
[45] Date of Patent: Sep. 5, 2000

[54] DYNAMIC RAM HAVING WORD LINE VOLTAGE INTERMITTENTLY BOOSTED IN SYNCHRONISM WITH AN EXTERNAL CLOCK SIGNAL

[75] Inventors: Yoshitaka Kinoshita, Akishima; Kenji Nishimoto, Urawa; Kazumasa Yanagisawa, Kokubunji; Hitoshi Tanaka, Ome, all of Japan

[73] Assignees: Hitachi, Ltd.; Hitachi ULSI Engineering Corp., both of Tokyo, Japan

[21] Appl. No.: 09/023,880

[22] Filed: Feb. 13, 1998

[30] Foreign Application Priority Data

Feb. 14, 1997 [JP] Japan .................................. 9-046997

[51] Int. Cl.$^7$ ...................................... G11C 8/18
[52] U.S. Cl. .................... 365/233; 365/149; 365/230.06; 365/230.03; 365/189.09; 365/189.11; 365/226; 365/201
[58] Field of Search ...................................... 365/149, 233, 365/230.06, 189.09, 189.11, 226, 230.03, 201

[56] References Cited

U.S. PATENT DOCUMENTS

| 5,673,233 | 9/1997 | Wright et al. ........................... 365/233 |
| 5,687,134 | 11/1997 | Sugawara et al. ...................... 365/233 |

FOREIGN PATENT DOCUMENTS

| 62-501807 | 7/1987 | Japan . |
| 62-171095 | 10/1987 | Japan . |
| 63-13498 | 1/1988 | Japan . |
| 63-255897 | 10/1988 | Japan . |
| 1-162296 | 6/1989 | Japan . |
| 2-247892 | 10/1990 | Japan . |
| 4-42494 | 2/1992 | Japan . |
| 5-89673 | 4/1993 | Japan . |
| 5-151773 | 6/1993 | Japan . |
| 8-129884 | 5/1996 | Japan . |

*Primary Examiner*—Andrew Q. Tran
*Attorney, Agent, or Firm*—Antonelli, Terry, Stout & Kraus, LLP

[57] ABSTRACT

A bootstrap circuit is provided for a word line selector for setting word lines connected with dynamic memory cells at a select level corresponding to a first voltage and a nonselect level corresponding to a second voltage. The bootstrap circuit generates a bootstrap voltage which is given a difference substantially equal to the threshold voltage of address select MOSFETs with respect to the high level of bit lines connected with the memory cells, and feeds the bootstrap voltage to the selected word lines. The bootstrap circuit is activated in synchronism with a clock signal at a timing corresponding to an action mode designated by a command in an SDRAM before a precharge action, thereby changing the select level of the word lines from the first voltage to the bootstrap voltage.

30 Claims, 27 Drawing Sheets

DYNAMIC RAM HAVING WORD LINE VOLTAGE INTERMITTENTLY BOOSTED IN SYNCHRONISM WITH AN EXTERNAL CLOCK SIGNAL

BACKGROUND OF THE INVENTION

The present invention relates to a dynamic RAM (Random Access Memory) and, more particularly, to a technique which is effective when applied to a word line selecting technique in a synchronous dynamic RAM (hereinafter simply referred to as the "SDRAM").

When the high level of a bit line is written in a dynamic memory cell composed of a memory capacitor and an address select MOSFET, the select level of a word line has to be raised to a high level, which is made higher by the threshold voltage of the address select MOSFET than the high level of the bit line. In accordance with the trend toward microminiaturization of elements, the gate oxide film of the address select MOSFET is thinned, causing a problem with regard to the field intensity of the gate oxide film. In order to prevent aging dielectric breakdown of the gate oxide film, there has been described in Japanese Patent Laid-Open No. 1-162296/1989 a technique in which the select level of the word line is raised to the boosted voltage for a precharge period after the end of an Address Strobe (AS) cycle.

Moreover, the boosting of the voltage of the word line is disclosed in Japanese Utility Model Laid-Open Nos. 62-171095/1987 and 63-13498/1988, Japanese Patent Laid-Open Nos. 2-247892/1990, 4-42494/1992, 5-151773/1993, 62-501807/1987, 63-255897/1988, 8-129884/1995, and 5-89673/1993.

SUMMARY OF THE INVENTION

In the dynamic RAMs of the above-specified Laid-Opens, at the end of the AS cycle, that is, at the time the RAS signal changes from a low level to a high level, a restore signal t6RST is generated to boost the voltage of the boost line thereby to rewrite the memory cell. Since the rewrite action is inserted immediately after the entrance into the precharge period, more specifically, the word line is reset from the select level to the nonselect level after the end of the rewrite action, followed by a substantial half precharge action of the bit line. In short, it has been found by our investigation that the aforementioned rewrite action inevitably will prolong the precharge period itself, thereby causing a problem that the memory cycle time is accordingly prolonged.

An object of the invention Ls to provide a dynamic RAM in which aging dielectric breakdown of a gate oxide film is prevented, while the operating speed is accelerated. Another object of the invention is to provide a dynamic RAM which is equipped with a word line selector suited for low-voltage operations. The aforementioned and other objects and novel features of the invention will become apparent from the following description to be made with reference to the accompanying drawings.

A summary of representative features of the invention to be disclosed herein will be presented in the following. For a word line selector for setting word lines connected with dynamic memory cells to a select level corresponding to a first voltage and a nonselect level corresponding to a second voltage, there is provided a bootstrap circuit for generating a bootstrap voltage, which is given a difference substantially equal to the threshold voltage of address select MOSFETs with reference to the high level of bit lines connected with the memory cells, and for feeding the bootstrap voltage to the selected word lines, so that the bootstrap circuit is activated in synchronism with a clock signal at a timing corresponding to an action mode designated by a command in an SDRAM before a precharge action, thereby to change the select level of the word lines from the first voltage to the bootstrap voltage.

DETAILED DESCRIPTION OF THE INVENTION

Figure 1:
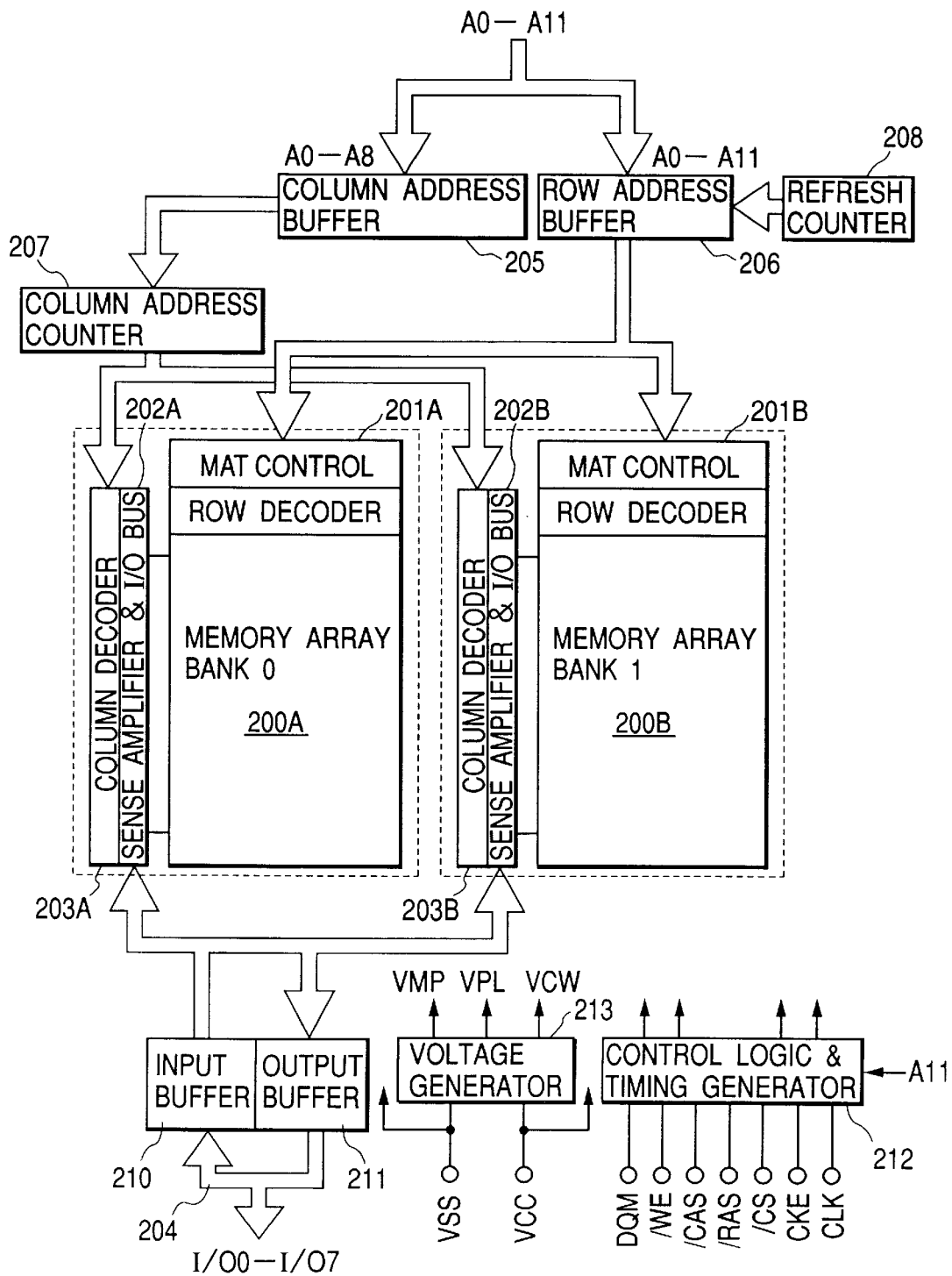
FIG. 1 is a schematic block diagram showing one embodiment of an SDRAM according to the invention.

FIG. 1 is a schematic block diagram of one embodiment of an SDRAM (Synchronous DRAM) according to the invention. The SDRAM, as shown, is formed over one semiconductor substrate of monocrystalline silicon by a known semiconductor integrated circuit manufacturing technique, although the invention is not especially limited thereto.

The SDRAM of this embodiment is so constructed as to include a memory array 200A constituting a memory bank 0 and a memory array 200B constituting a memory bank 1. Each of these memory arrays 200A and 200B is equipped with dynamic memory cells arranged in a matrix arrangement. As shown, the select terminals of the memory cells arranged in a column are coupled to (not-shown) word lines of each column, and the data input/output terminals of the memory cells arranged in a row are coupled to (not-shown) complementary bit lines of each row.

Substantially one of the not-shown word lines of the memory array 200A is driven to a select level in accordance with the decoding result of a row address signal by a row decoder and mat control 201A and a row timing signal. The not-shown complementary bit lines of the memory array 200A are coupled to a sense amplifier and column selector (sense amplifier & I/O bus) 202A. The amplifier in the sense amplifier and column selector 202A is an amplifier for detecting and amplifying a minute potential difference appearing in each complementary bit line by reading data from the memory cells. A column switch circuit in the same is a switch circuit for selecting the complementary bit lines individually to couple them to a complementary common input/output line (or I/O bus) 204. The column switch circuit is selected according to the decoding result of a column address signal by a column decoder 203A.

On the memory array 200B side, like the memory array 200A side, there are provided a row decoder and mat control 201B, a sense amplifier and column selector (sense amplifier & I/O bus) 202B, and a column decoder 203B. The complementary common input/output line (I/O bus) 204 for the memory banks 200A and 200B is connected with the output terminal of an input buffer 210 and with the input terminal of an output butter 211. The input terminal of the input buffer 210 and the output terminal of the output buffer 211 are connected with 8-bit data input/output terminals I/O0 to I/O7, although the invention is not especially limited thereto.

Row address signals and column address signals fed from address input terminals A0 to A11 are fetched in an address multiplex manner by a column address buffer 205 and a row address buffer 206. The address signals thus fed are latched in the buffers 205 and 206. However, the row address buffer 206 latches a clock signal CLK for one period, unlike the prior art latching of one memory cycle period. On the contrary, the column address buffer 205 latches, as in the prior art, the column address signal which is fetched for one memory cycle period.

In a refresh action mode, the row address buffer 206 fetches the refresh address signal outputted from a refresh counter 208 as the row address signal. The output of the column address buffer 205 is fed as preset data of a column address counter 207 according to the action modes designated by Later-described commands, and the column address counter 207 outputs either the column address signals or the sequentially incremented values of the column address signals, as preset data to the column decoders 203A and 203B.

A controller (control logic & timing generator) 212 is fed with external control signals, such as the clock signal CLK, a clock enable signal CKE, a chip select signal ICS, a column address strobe signal /CAS (symbol / indicates that a signal with this symbol is a row enable signal), a row address strobe signal /RAS, a write enable signal /WE and a data input/output mask control signal DQM, and the control data from the address input terminal A11, although the invention is not especially limited thereto, to generate exemplified internal timing signals for controlling the action modes of the SDRAM and the actions of the aforementioned circuit blocks, on the basis of changes in the levels and the timings of those signals. For this, the controller 212 is provided with a control logic and mode register.

The clock signal CLK is used as a master clock signal of the SDRAM, and the other external input signals are made significant in synchronism with the rising edge of the internal clock signal. The chip select signal ICS orders the start of the command input cycle with its low level. No meaning is obtained either when the chip select signal ICS is at the high level (in the chip nonselect state) or by other inputs. However, the selected state of the later-described memory bank or the internal action, such as a bursting action, is not influenced by the change to the chip nonselect state. The individual signals /RAS, /CAS and /WE are different in their functions from the corresponding signals in an ordinary DRAM and are made significant when defining the later-described command cycle.

The clock enable signal CKE is a signal representing the effectiveness of the next clock signal, and the rising edge of the next-clock signal CLK is made effective when the signal CKE is at the high level and is made ineffective when it is at the low level. In the read mode, moreover, the external control signal DQM for the output enable control of the output buffer 211 is also fed to the controller 212, and the output buffer 211 is brought into a high output impedance state, when the signal DQM is at the high level, for example.

The row address signal is defined by the levels of the inputs A0 to A11 in the later-described row address strobe/bank active command cycle synchronized with the rising edge of the clock signal CLK (the internal clock signal). The input A11 is treated as the bank select signal in the row address strobe bank active command cycle. In short, the memory bank 0 is selected when the input A11 is at the low level, and the memory bank 1 is selected when it is at the high level. The selection control of the memory banks can be performed by a processing such as the activation of only the row decoder on the selected memory bank side, nonselection of all the column switch circuits on the nonselected memory bank side, or the connection with the input buffer 210 and the output buffer 211 only on the selected memory bank side, although the invention is not especially limited thereto.

The input A10 in the later-described precharge command cycle specifies the modes of the precharge actions of the complementary bit lines, the high level indicating that both the memory banks are to be precharged and the low level indicating that one of the memory banks indicated by the input A11 is to be precharged. The column address signal is defined by the levels of the inputs A0 to A8 in the read or write command (the later-described column address read command, and column address write command) cycle synchronized with the rising edge of the clock signal CLK (the internal clock). The column addresses thus defined are used as the start addresses for the burst access.

The major action modes of the SDRAM to be ordered by the commands will be explained.

(1) Mode Register Set Command (Mo)

This is a command for setting the mode register and is designated by ICS, /RAS, /CAS and /WE=Low Level, and the data to be set (register set data) are fed through the inputs A0 to A11. These register set data may be a burst length, a CAS latency and a write mode, although the invention is not especially limited thereto. The settable burst length is 1, 2, 4, 8 or a full page (256); the settable CAS latency is 1, 2 or 3; and the settable write mode is a burst write or a single write, although the invention is not especially limited thereto.

The CAS latency represents how many cycles of the internal clock signals are consumed from the fall of the /CAS to the output action of the output buffer 211 in the read action, ordered by the later-described column address read command. An internal action time period for reading the data is required till the read data are fixed, and is set according to the frequency of the internal clock signal. In other words, the CAS latency is set at a relatively high value when an internal clock signal having a high frequency is used, and is set to a relatively low value when an internal clock signal having a low frequency is used. In the later-described image processing, the CAS latency can be set at a high value, if necessary, for ensuring the time period for switching the word lines, although the invention is not especially limited thereto.

(2) Row Address Strobe/Bank Active Command (Ac)

This is a command for activating the instruction of the row address strobe and the selection of the memory banks and is designated by ICS and /RAS=Low Level, and by /CAS and /WE=High Level. The addresses fed to the inputs A0 to A10 are fetched as the row address signals, and the signal fed to the input A11 is fetched as the signal for selecting one of the memory banks. These fetching actions are performed in synchronism with the rising edge of the internal clock signal, as described above. When the command is designated, for example, a word line in the memory bank designated thereby is selected so that the memory cells connected with the selected word line are electrically connected to the corresponding complementary bit lines.

(3) Column Address/Read Command (Re)

This is a command necessary to start the burst read action and to designate the column address strobe and is designated by ICS and /CAS=Low Level, and by /RAS and /WE=High Level. The column address fed at this time to the inputs A0 to A8 are fetched as the column address signals. The column address signals thus fetched are fed as the burst start addresses to the column address counter 207. In the burst read action thus instructed, the memory banks and their word lines are selected in the preceding row address strobe bank active command cycle, and the memory cells of the selected word lines are sequentially selected and consecutively read out according to the address signals which are outputted from the column address counter 207 in synchronism with the internal clock signal. The number of data to be consecutively read out is designated by the aforementioned burst length. Moreover, the start of the data read from the output buffer 211 is effected after the cycles of the internal clock signals, the number of which is specified by the aforementioned CAS latency.

(4) Column Address/Write Command (Wr)

This is a command necessary to start the burst write action, when the burst write is set as the mode of the write action in the mode register, and to start the single write action when the single write is set as the write action mode in the mode register. Moreover, this command designates the column address strobe in the single write and in the burst write. This command is designated by ICS, /CAS and /WE=Low Level, and by /RAS=High Level, and the addresses fed at this time to the inputs A0 to A8 are fetched as the column address signals. The column address signals thus fetched are fed as the burst start addresses to the column address counter 207 in the burst write. The procedure of the burst write action instructed thereby is performed like the burst read action. However, the write action has no CAS latency, and the fetch of the write data is started from the column address write command cycle.

(5) Precharge Command (Pr)

This is a command for starting the precharge action for the memory banks selected by the inputs A10 and A11 and is designated by /CS, /RAS and /WE=Low Level, and by /CAS=High Level.

(6) Auto Refresh Command

This is a command necessary to start the auto refresh and is designated by ICS, /RAS and /CAS=Low Level, and by /WE and CKE=High Level.

(7) Burst Stop In Full Page Command

This is a command necessary to interrupt the burst action for the full page to all the memory banks and is ignored in the burst action other than the full page. This command is designated by ICS and /WE=Low Level, and by /RAS and /CAS=High Level.

(8) No Operation Command (Nop)

This is a command for instructing no substantial operation and is designated by /CS=Low Level and by /RAS, /CAS and /WE=High Level.

In the SDRAM, while the burst action is being made in one memory bank, the action of the row address system in the other memory bank is enabled when the other memory bank is designated and the row address strobe bank active command is fed, without affecting the action being made in the one memory bank.

So long as the data do not conflict in the data input/output terminals I/O0 to I/O7, therefore, the internal action can be started in advance by issuing the precharge command and the row address strobe bank active command to the memory bank other than the memory bank where processings are done by the command being executed, during the execution of the command of which processing is not ended.

The SDRAM can input and output the data, the addresses and the control signals in synchronism with the clock signal CLK (the internal clock signal), so that it can operate a high capacity memory whose capacity is equivalent to that of the DRAM at a high speed compared with that of the SRAM. It is also understood that the selected states of the column system can be sequentially switched in the built-in column address counter 207 to read or write a plurality of data consecutively by designating, by using the burst length, how many data are to be accessed for one selected word line.

A voltage generator 213 generates various kinds of voltage necessary for the actions of the aforementioned internal circuits. For example: symbol VPL designates a bias voltage to be fed to the plates of capacitors constituting the memory cells; symbol VMP designates a precharge voltage of the complementary bit lines or the like; and symbol VCW designates a first voltage for determining the select level of the word lines, i.e., the activate voltage of the row address selector. The voltage generator 213 is made up of a plurality of kinds of voltage generator, as will be described hereinafter, for generating not only the aforementioned individual voltages VPL, VMP and VCW, but also a substrate back bias voltage VBB, an activate voltage fed to the sense amplifiers and so on, if necessary.

Figure 2:
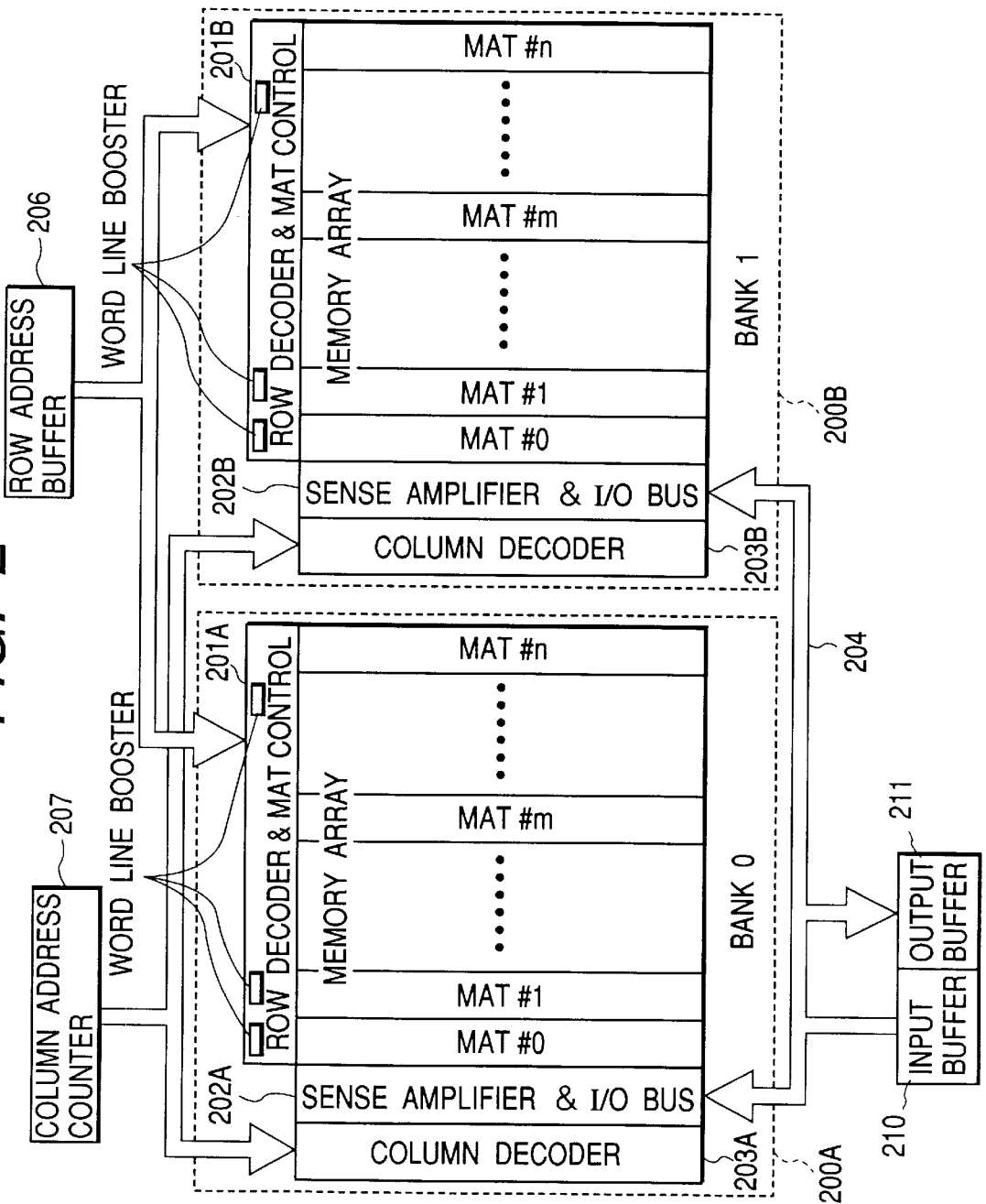
FIG. 2 is a schematic diagram of one embodiment for explaining a memory array unit in the SDRAM and an address selector unit associated therewith according to the invention.

FIG. 2 is a schematic block diagram of one embodiment for explaining the memory array unit in the SDRAM according to the invention and an address selector unit associated therewith. In FIG. 2, the two memory banks (Bank0 and Bank1) 200A and 200B and the row and column address selectors therefor are mainly shown, but the elements for timing control and so on of FIG. 1 are omitted.

Take the case of the memory bank 200A which is divided into a plurality of memory mats #0 to #n. The row decoder 201A selects one of the memory mats #0 to #n and selects the word lines of the selected memory mat. As the storage capacity increases, the number of memory cells connected with one word line increases. When the word line is divided into a main word line and divided sub word lines which are connected with the memory cells, as known in the art, the main word line is then regarded as a kind of address select line.

The word line comprising the main word line and the sub word lines, is made to correspond to the sub word lines which are actually connected with the memory cells. In other words, the construction of the memory mats #0 to #n, as shown, has no relation to the geometrical arrangement over the actual semiconductor chip but expresses it functionally. As a matter of fact, therefore, the aforementioned main word line is regarded, if actually present, as the address select line and is so contained in the row decoder that the row decoder is shown to select one of the word lines (sub word lines) provided directly to the individual memory mats. The row decoder 201A selects one word line for the memory mat which is selected by the mat control 201A. Word line boosters (bootstrap circuits) are provided one-to-one for the individual memory mats #0 to #n. Only those word line boosters which correspond to the selected memory mats act to raise the potential of the word lines to a boosted level either intermittently in synchronism with the clock signal CLK or only for a half period of one clock cycle of the clock signal, as will be described hereinafter.

In FIG. 2, the sense amplifier and column selector 202A is provided in common to the memory mats #0 to #n. In the dynamic RAM, as known in the art, however, when the word lines are selected to connect the memory cells with the bit lines, the stored charges of the selected memory cells are substantially broken. When the word lines are selected, the corresponding sense amplifiers have to be activated to amplify the read signals appearing on the bit lines and thereby to return the stored charges of the memory cells to the initial state. Therefore, the sense amplifier and column selector 202A is provided for each memory mat. Because of the functional illustration of FIG. 2, however, the sense amplifiers and column selectors 202A are shown altogether as one circuit block.

The construction described above likewise holds for that of the other memory bank 200B. Moreover, the description of the row address buffer 206, the column address counter 207, the input buffer 210 and the output buffer 211 to act as the peripheral circuits relating to the individual memory banks 200A and 200B is the same as the aforementioned one of FIG. 1, and so the description thereof will be omitted.

Figure 3:
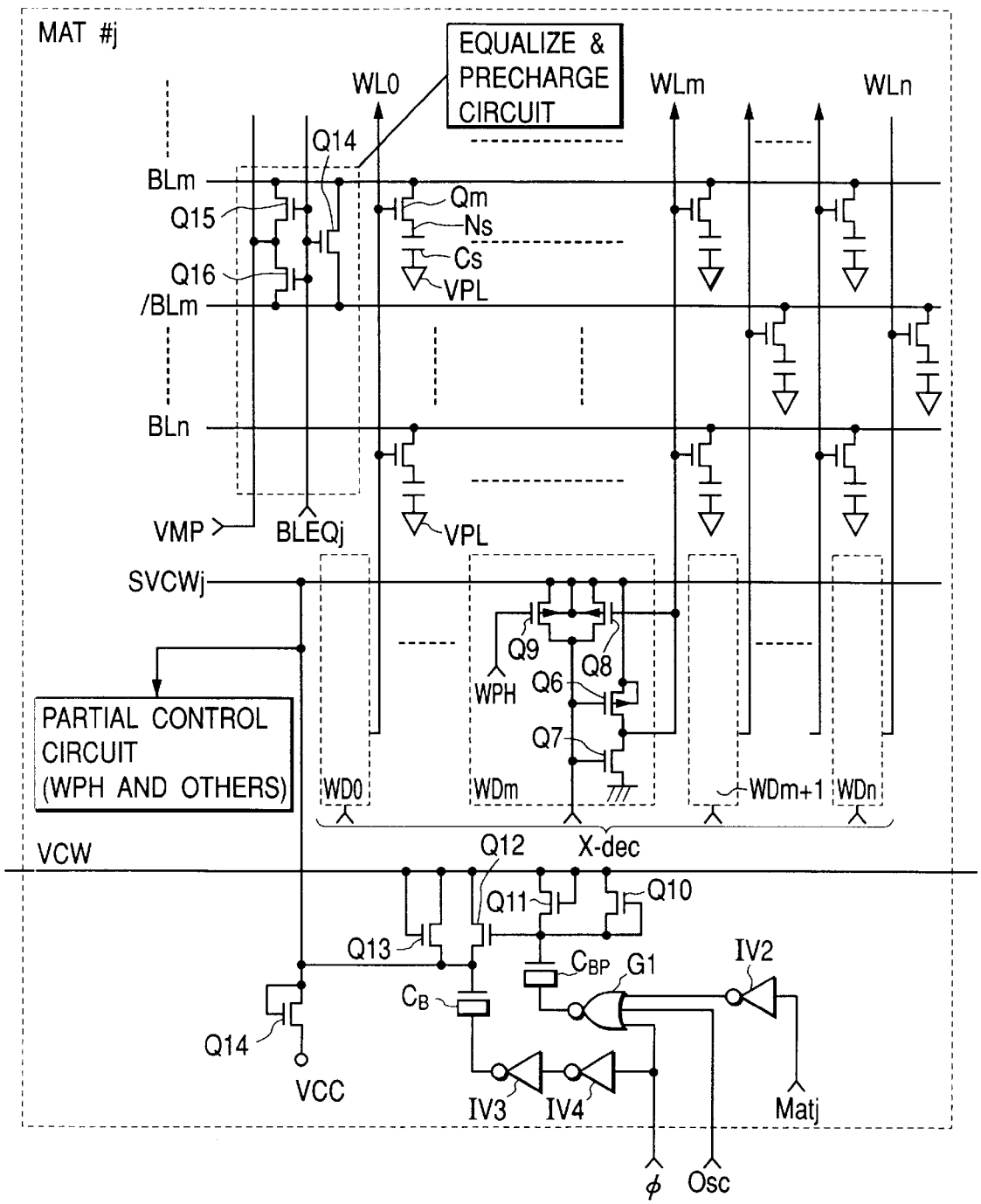
FIG. 3 is a circuit diagram showing one embodiment of a memory array unit, a word line driver and a word line booster of one memory mat of FIG. 2.

FIG. 3 is a circuit diagram showing one embodiment of the memory array unit, the word line driver and the word line booster of one memory mat. In FIG. 3, the memory mats #0 to #n are represented by one memory mat #j. A plurality of complementary bit lines and a plurality of word lines provided to the memory mat #j are representatively represented by a pair of complementary bit lines BLm and /BLm, one bit line BLn, and word lines WL0, WLm, WLm+1 and WLn.

The memory cell arranged at the intersection between the word line WL0 and the bit line BLm will be explained by way of example. The gate of an address select MOSFET Qm is connected with the word line. One of the source and drain of the MOSFET Qm is connected with the bit line BLm and the other is connected with a storage node Ns or one electrode of a memory capacitor Cs. The other electrode of the memory capacitor Cs is commonly connected with the other electrode of the memory capacitor of another memory cell and is fed with a plate voltage VPL.

Such memory cells are arranged in a matrix arrangement at the intersections between the word lines and ones of the complementary bit lines. On the word line WLm and the adjoining word line WLm+1, for example, a memory cell is disposed at the intersection between the word line WLn and one BLm of the complementary bit lines, and a memory cell is disposed at the intersection between the word line WLm+1 and the other /BLm of the complementary bit lines. The memory cells are thus arranged between every pair of odd- and even-numbered word lines and alternately to one and the other of complementary bit lines. Alternatively, two adjacent word lines may be paired and every two memory cells provided for every two word lines may be arranged alternately to one and the other of the complementary bit lines.

The complementary bit lines BLm and /BLm are equipped with N-channel MOSFETs Q14 to Q16 constituting an equalize & precharge circuit. The MOSFET Q14 short-circuits the complementary bit lines BLm and /BLm and short-circuits the high level and the low level (the low level and the high level) of the complementary bit lines BLm and /BLm to set a half potential. The MOSFETs Q15 and Q16 prevent the short-half potential, set up by the shortcircuit, of the complementary bit lines BLm and /BLm, from being fluctuated by a leakage current or the like, and feed the half precharge voltage VMP to the complementary bit lines BLm and /BLm. The gates of the MOSFETs Q14 to Q16 are commonly connected and fed with a precharge & equalize signal BLEQj. In short, after the word lines are reset from the select level to the nonselect level, the signal BLEQj changes to the high level to turn on the MOSFETs Q14 to Q16, thereby effecting the precharge and equalize actions of the complementary bit lines BLm and /BLm.

For the plurality of word lines WL0 to WLn, there are provided a plurality of word line drivers WD0 to WDn. These word line drivers WD0 to WDn are activated by the voltage which is fed to a sub power supply line SVCWj which is provided one-to-one for the memory mat #j. In FIG. 3, the word line drivers are represented by a word line driver WDm corresponding to the word line WLm, as shown in a concrete circuit. In the word line driver WDm, there is employed a CMOS inverter which comprises a P-channel MOSFET Q6 having a source connected with the sub power supply line SVCWj and an N-channel MOSFET Q7 having a source connected with the ground potential of the circuit. The drains of the MOSFETs Q6 and Q7 are commonly connected to form an output terminal, which is connected with the word line WLm. The gates of the MOSFETs Q6 and Q7 are commonly connected to form an input terminal, which is fed with a select signal from an X-decoder X-dec.

Between the input terminal of the CMOS inverter (Q6 and Q7) and the sub-power supply line SVCWj, there are connected in parallel a P-channel MOSFET Q9 having a source-drain path and a P-channel MOSFET Q8 for nonselect latching. The gate of this nonselect latching P-channel MOSFET Q8 is connected with the output terminal of the, CMOS inverter (Q6 and Q7). The precharging P-channel MOSFET Q9 is fed at its gate with a precharge signal WPH. This precharge signal WPH is generated by a signal generator whose activation voltage is the voltage of the sub power supply line SVCWj.

In this embodiment, the word line booster (bootstrap circuit) comprising N-channel MOSFETs Q10 to Q14, capacitors CB and CBP, inverters IV2 to IV4 and gate circuits G1 and G2. This word line booster is activated by the internal voltage VCW corresponding to the first voltage. The diode-connected MOSFET Q11 acts as a precharge MOSFET for precharging the capacitor CBP. The diode-connected MOSFET Q10 connected in parallel with the MOSFET Q11 acts as a limiter MOSFET. Specifically, the MOSFET Q11 is connected at its gate with the supply voltage VCW, and acts to precharge the capacitor CBP to VCW−Vth11 (Vth11 designates the threshold voltage of the MOSFET Q11) when the output signal of the gate circuit G1 is at the low level such as the ground potential of the circuit. The MOSFET Q10 is connected at its-gate with the capacitor CBP, and acts to limit the potential boosted by the capacitor CBP, to a value less than the VCW+Vth10 (Vth10 designates the threshold voltage of the MOSFET Q10) when the output signal of the gate circuit G1 is raised to the high level.

Since the boosted voltage (VCW+Vth10) is intermittently generated, as described above, the potential of the sub power supply line SVCWj is kept at a level equal to the internal voltage VCW through the MOSFET Q12. When the mat #j is selected, a mat select signal Matj takes the high level to set the output signal of the inverter IV2 at the low level, thereby opening the gate of the NOR gate circuit G1. In synchronism with an oscillated pulse Osc and a clock signal V, the output signal changes to the high/low level, and the aforementioned intermittent action can be performed. In the nonselected memory mat, the mat select signal Matj remains at the low level, and the output signal of the inverter IV2 is fixed at the high level, so that the NOR gate circuit G1 closes the gate to fix the output at the low level. The capacitor CBP is left in the precharged state.

The capacitor CB is precharged with the voltage VCW of the sub power supply line SVCWj of the memory mat #j. When the clock-signal φ is at the low level, the output signal of the inverter IV3 takes the low level, too, so that the capacitor CB is precharged with the voltage VCW. When the clock signal φ changes to the high level, a boosted voltage such as 2VCW is generated by the capacitor CB. As a result, the boosted voltage 2VCW is transmitted intermittently in synchronism with the clock signal φ, and the potential of the sub power supply line SVCWj is raised to a boosted voltage not less than the action voltage VCW in accordance with the capacitance ratio to the parasitic capacitance in the sub power supply line SVCWj.

The MOSFET Q14 is provided for a level limiter. When the sense amplifier acts with a power supply voltage VCC, the high level of the potential of the complementary bit line BLm or /BLm corresponds to the power supply voltage VCC, and the potential of the sub power supply line SVCWj is limited to less than the supply voltage VCC+Vth14.

Specifically, the CMOS inverter (Q6 and Q7) is activated by the sub power supply line SVCWj, and the select level of the selected word line WLm is determined according to the potential of the sub power supply line SVCWj. By designing the MOSFET Q14 and the adress select MOSFET Qm under identical conditions, the high level of the potential of the complementary bit line BLm or /BLm can be transmitted to the capacitor Cs with no level loss.

In this embodiment, as will be described hereinafter, the potential of the word lines is made higher by the threshold voltage of the address select MOSFET than the bit line potential in synchronism with the clock signal φ. When the pulse duty of the clock signal φ is set at 50%, the high voltage is not applied for one half of the select period of the word lines, and it is effective in preventing aging dielectric breakdown in the gate insulating film of the address select MOSFET. The clock signal φ is a pulse which is generated by the logical product of a word line select timing signal and the clock signal CLK fed from the external terminal, although not shown, and is fed for the word line select period.

In the nonselected memory mat of FIG. 3, the capacitor CB of the corresponding word line booster is precharged to as little as VCW−Vth13 by the MOSFET Q13, and the sub power supply line SVCW of the word line driver is raised by a small voltage with respect to the boosted voltage of the sub power supply line SVCWj of the selected memory mat #j. The potential change of the sub power supply line SVCW corresponding to the nonselected memory mat has no meaning by itself. To avoid a useless action, therefore, the action of the word line booster of the nonselected memory mat may be interrupted with the low level of a mat select signal Mat.

Figure 4:
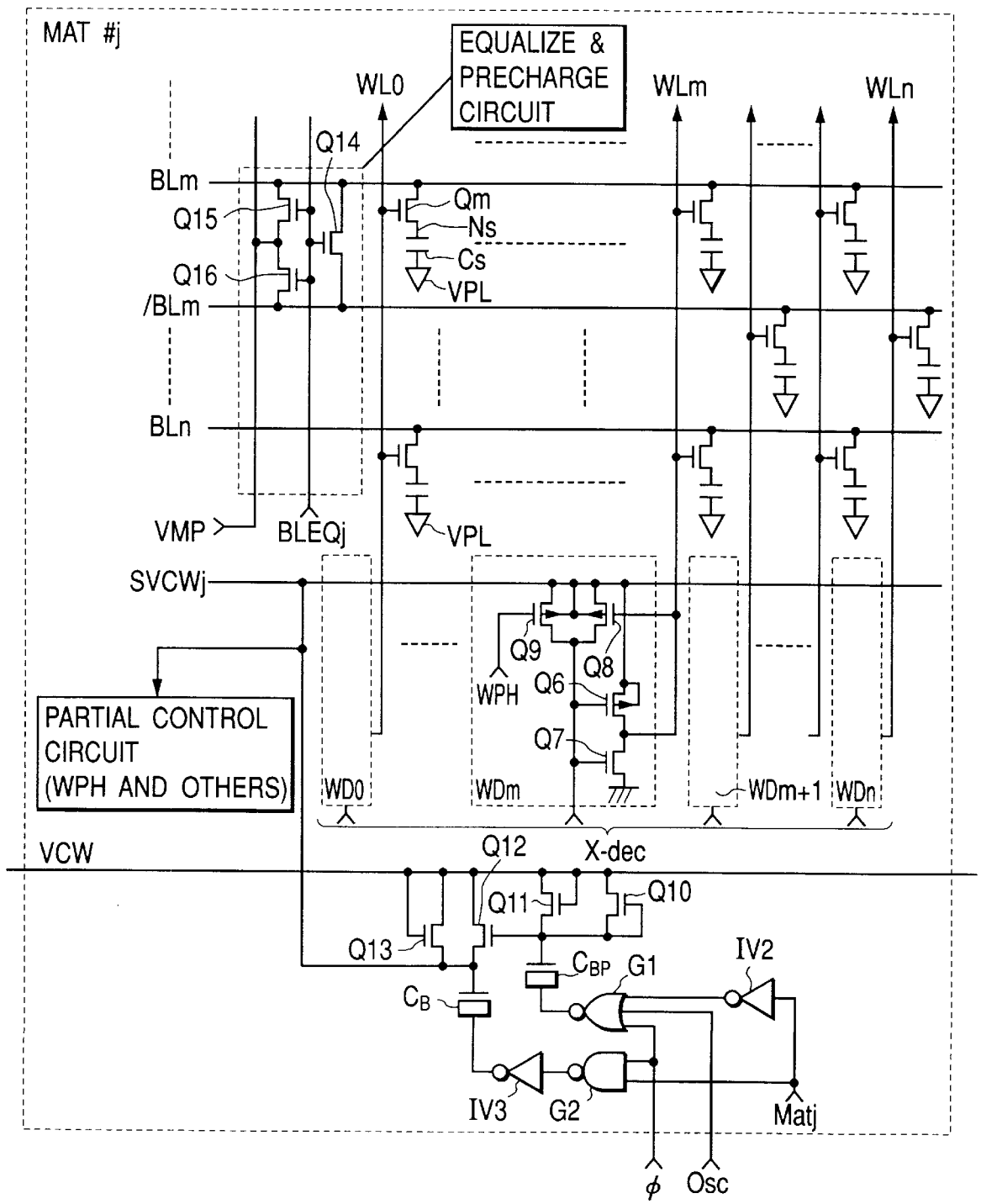
FIG. 4 is a circuit diagram showing another embodiment of a memory array unit, a word line driver and a word line booster of one memory mat of FIG. 2.

FIG. 4 is a circuit diagram showing another embodiment of the word line booster. In FIG. 4, the memory array unit and the word line driver of one memory mat associated with the word line booster are shown as in FIG. 3. The description of the memory array unit and word line driver will be omitted because they are similar to those of FIG. 3.

The word line booster of this embodiment is activated once for one memory cycle. Specifically, the word lines are set at a value not less than the threshold voltage of the address select MOSFET for the high level of the bit lines only so that the high level may be fully written in the capacitors of the memory cells when the signal amplified by the sense amplifier is rewritten in the memory cells. Since the time period required for this full write is extremely short, the word line booster is; activated by the pulse 1φ which is generated once in synchronism with the clock signal φ. Since the boosting time period by the pulse 1φ can be made far shorter than the memory cycle time period, moreover, aging dielectric break-down of the gate insulating film of the address select MOSFET is more effectively prevented.

In this embodiment, in order that the word line booster may be inactivated when the memory mat #j is not selected, the pulse 1φ is fed through a NAND gate G2 to the inverter IV3. Moreover, the gate circuit G2 is controlled by the mat select signal Matj. Specifically, when the mat select signal Matj is at the low level in the nonselected state, the output signal of the NAND gate circuit G2 is fixed at the high level independently of the pulse φ. As a result, the output signal of the inverter IV3 is kept at the low level to keep the capacitor CB in the precharged state. This gate circuit can also interrupt, if used in the embodiment of FIG. 3, the action of the word line booster corresponding to the nonselected mat even in the embodiment of FIG. 3.

In the case of an SDRAM the end cycles of its read action and write action can be indicated according to the action mode which is designated by the command. This is fundamentally different from the dynamic RAM of the prior art, in which the end of the memory cycle is resultantly found from the precharge action started by resetting the RAS signal to the high level. This is utilized in the invention to generate the pulse 1φ for activating the word line booster at the final timing of the memory cycle before the transition to the precharge action, although the invention is not especially limited thereto. This generation of the pulse 1φ at the end of the memory cycle is important for ensuring the fixation of the write data in the write cycle. In the burst write mode, more specifically, the write data fetched in the latch type sense amplifiers provided for the individual complementary bit lines have to be written altogether in the memory cells after the fetch of the write data inputted lastly in synchronism with the clock signal.

Figure 5:
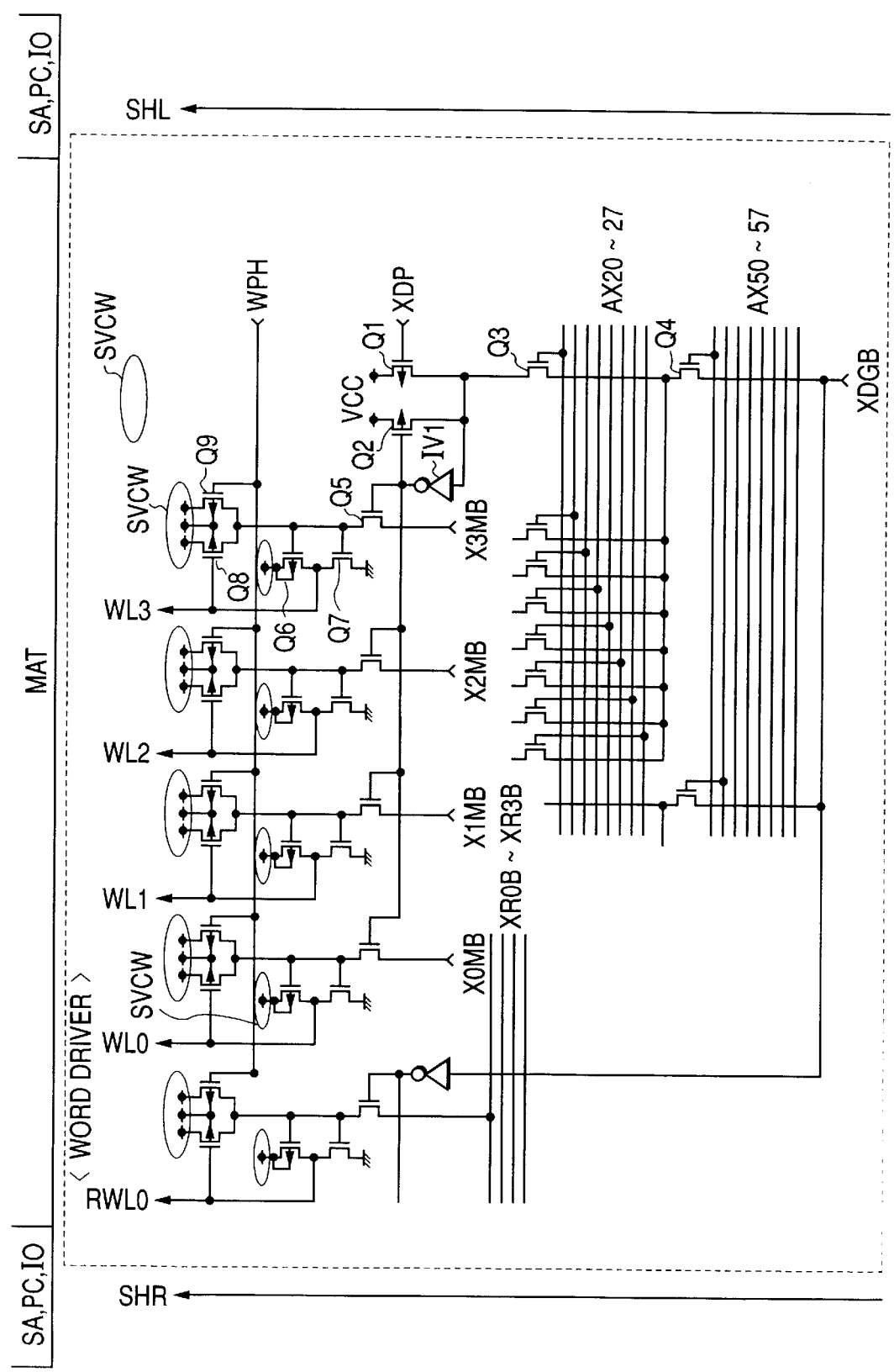
FIG. 5 is a specific circuit diagram showing one embodiment of the row decoder of FIGS. 3 and 4 and a word driver provided thereto.

FIG. 5 is a specific circuit diagram of one embodiment of the row decoder and a word driver provided thereto. Signals AX20 to AX27 are generated by predecoding the address signals A2 to A4 of 3 bits by the predecoder, and signals AX50 to AX57 are generated by predecoding the address signals A5 to A7 of 3 bits by the predecoder. A MOSFET Q3 fed at its gate with one of the predecode signals AX20 to AX27, and a MOSFET Q4 fed at its gate with one of the predecode signals AX50 to AX57 are connected in series, constituting the row decoder (X-DEC) fed with a select timing signal XDGB.

The row decoder (X-dec) comprises a dynamic logic circuit which is equipped with a P-channel precharge MOSFET Q1 switched with-a precharge signal XDP, an inverter for latching a nonselect; level, and a P-channel MOSFET Q2. The select/nonselect signal is generated depending upon whether or not the node precharged to the high level by the precharge MOSFET Q1 is discharged by the low level of the timing signal XDGB through the MOSFETs Q3 and Q4.

Upon receiving the output signal of the inverter, the P-channel MOSFET Q2 feeds back the signal at the high level to its input. In this MOSFET Q2, the decoded output is such that the MOSFET Q3 or Q4 turned off with predecoded outputs AX2i and AX5i takes the high level,which was precharged by the precharge MOSFET Q1. At this high level, the MOSFET Q1 is turned off at the end of the precharge period, arid the MOSFET Q3 or Q4 is turned off with the predecodled output AX2i or AX5i to establish the floating state, with the result that the select level may be undesirably changed from the high level to the low level by the coupling or the leakage current. When receiving the low level of an inverter IV1,the feedback P-channel MOSFET Q2 is turned on to keep the input level of the inverter at the power supply voltage VCC.

The output signals of the inverter are select signals corresponding to four word lines WL0 to WL3, although the invention is not especially limited thereto. From these four word lines WL0 to WL3, one word line designated by four word line select timing signals X0MB to X3MB, which are prepared by decoding the address signals A0 and A1 of lower order bits and by adding the select timing signals thereto, is selected.

In short, when the output signal of the inverter is at the selected high level, a MOSFET Q5 is on. When one word line select timing signal X3MB changes from the high level to the low level, the word driver comprising the P-channel MOSFET Q6 and the N-channel MOSFET Q7, activated with the voltage of the sub power supply line SVCW, is fed with an input signal at the low level to raise the word line WL3 connected with its output terminal, from the low level to the high level corresponding to the voltage of the sub power supply line voltage SVCW.

When the output signal of the inverter is at the selected high level, not only the MOSFET Q5 but also the other MOSFETs are on, but the word line select timing signals XOMB to X2Mb remain at the high level so that the N-channel MOSFETs of the word driver are turned on, leaving the word lines WL0 to WL2 at the low level in the nonselected state. The P-channel MOSFET Q8 is a nonselect level latching MOSFET, and is on when the word line WL3 is at the nonselected low level, setting the input terminal of the word driver to the sub power supply voltage SVCW and thereby turning off the P-channel MOSFET Q6. The P-channel MOSFET Q9 is a precharge MOSFET, and is turned on with the low level of the precharge signal WPH, precharging the input terminal of the word driver to the voltage of the sub power supply line SVCW.

When the output signal of the inverter is at the nonselect level, the MOSFETs represented by the MOSFET Q5 are off. Even when any of the word line select timing signals X0Mb to X3MB changes from the high level to the low level, the P-channel MOSFET Q8 is turned on irrespective of the change but in accordance with the low level of the word lines WL0 to WL3 corresponding to the precharge level, causing a latch such that a high level corresponding to the SVCH is fed back to the input terminal of the word driver, and thereby keeping the nonselect state of the word lines WL0 to WL3 and so on.

A redundancy word line RWL0 is also equipped with a word driver, a latching MOSFET and a precharge MOSFET similar to the aforementioned ones. This redundant word line RWL0 is selected in synchronism with the aforementioned select timing signal XDGB and a redundant word line select signal XR0B which is generated by a redundancy circuit comprising a not-shown faulty address storing fuse circuit and an address comparator for comparing a faulty address and an X-address. At this time, in accordance with the comparison coincidence signal of the faulty address, the word line select timing signals X0MB to X3MB are changed to the nonselected level, so that the predecoders AX20 to AX27 and AX50 to AX57 which are normal circuits do not perform select operation of the faulty word lines.

The memory array of this embodiment is divided into the memory mats, as described hereinbefore, although the invention is Dot especially limited thereto. Sense amplifiers SA, precharge circuits PC and input/output lines are provided on both sides of a memory mat MAT. In order to match the pitch of the complementary bit lines arranged at right angles with respect to the word lines WL0 to WL3 or the like, to the pitch of the sense amplifiers and the precharge circuits, the sense amplifiers corresponding to the odd-numbered complementary bit lines and the even-numbered complementary bit lines are dividedly arranged on the right and left sides, although the invention is not especially limited thereto. This arrangement makes it possible to arrange one sense amplifier SA at a pitch two times as large as that of the complementary bit lines.

In this embodiment, the sense amplifiers are of the shared type, and signals SHL and SHR are the shared select signals, although the invention is not especially limited thereto. Although in FIG. 5 the right and left sides appear laterally inverted, if the sense amplifier SA is viewed as the center, the memory mat is disposed on the left side, as viewed from the righthand sense amplifier SA. Therefore a select signal SHL is fed. On the other hand, the memory mat is disposed on the right side, as viewed from the lefthand sense amplifier SA, so that a select signal SHR is fed. These select signals SHL and SHR are signals for controlling the switch MOSFETs for switching the connection between the complementary bit lines and the input/output nodes of the sense amplifiers, so that the aforementioned boosted voltage is so generated in synchronism with the word lines as to eliminate the level loss by their threshold voltages. Thus, the action voltage of the driver for generating those select signals SHL and SHR is fed from the sub power supply line SVCW.

Figure 6:
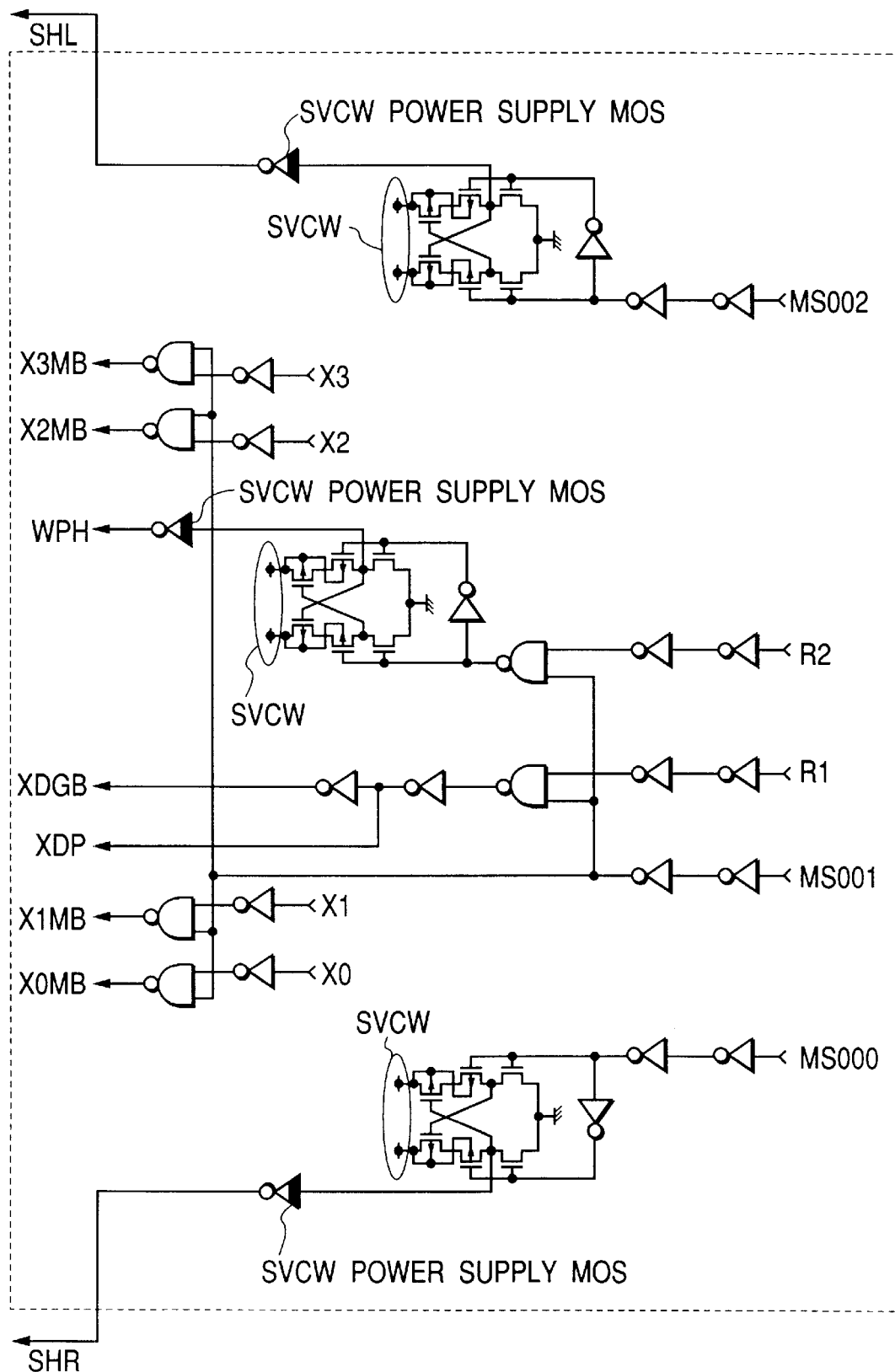
FIG. 6 is a circuit diagram showing one embodiment of the mat control of FIGS. 3 and 4.

FIG. 6 is a circuit diagram showing one embodiment of the mat control unit. Address signals of higher order are decoded to generate mat select signals MS000, MS001, MS002 and so on. The memory mat MAT, as shown in FIG. 5, is selected with the signal MS001. This mat select signal MS001 is fed through two series inverters to four NAND gate circuits. These four NAND gate circuits are individually fed with timing signals X0 to X3, which are generated by combining the decoded signals generated by decoding the address signals A0 and A1 with the word line select timing signals, through the inverters. As a result, the word line select timing signals X0MB to X3MB are generated from the outputs of the individual NAND gate circuits. This means that the predecode signals AX20 to AX27 and AX50 to AX57 and the timing signals X0 to X3 are used commonly for the memory mats.

Row timing signals R1 and R2 are combined with the mat select signal MS001 to generate the precharge signals XDP and WPH and the row decoder action timing signal XDGB. The precharge signal WPH is the signal which is fed to the gate of the P-channel MOSFET to be activated with the voltage of the sub power supply line SVCW, so that it is converted in level by the level converter and outputted through the inverter to be activated by an SVCW power supply MOS. The mat select signals MS000 and MS002 having a signal amplitude such as the power supply voltage VCC are also converted in their levels into the signal amplitude corresponding to the voltage SVCW by the level converters to generate the shared select signals SHR and SHL. As the voltage of the sub power supply line SVCW is boosted by the word line booster, the individual signals WPH, and SHL and SHR are made the boosted voltage synchronized with the word lines.

Figure 7:
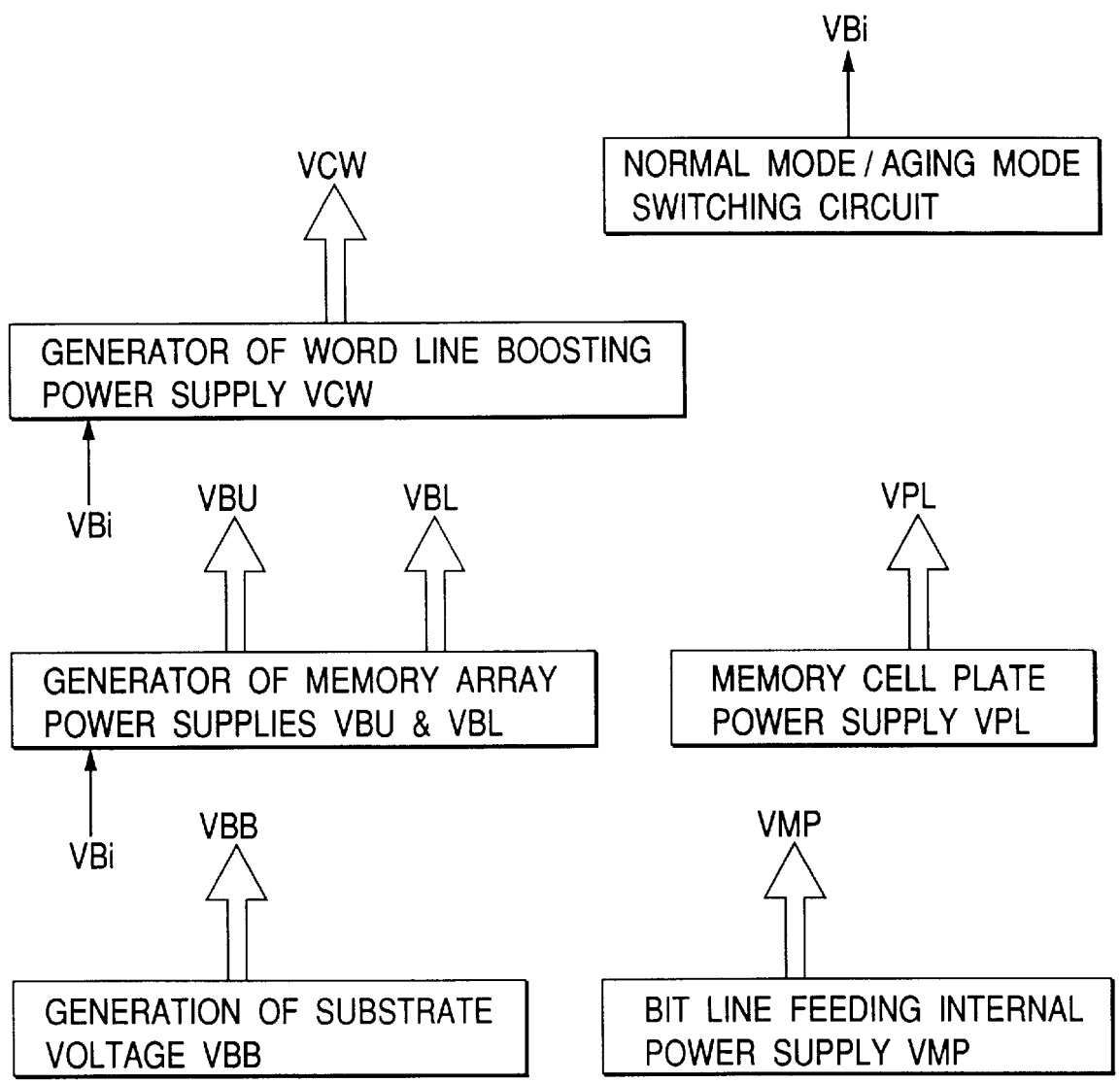
FIG. 7 is a block diagram showing one embodiment of the voltage generation unit included in a voltage generator 213 of FIG. 1.

FIG. 7 is a block diagram showing one embodiment of a voltage generation unit included in the voltage generator 213 of FIG. 1. This embodiment is so constructed as to include voltage generation units for generating six voltages and a switch circuit for generating a control signal to switch the action at the aging time. A word line boosting power source VCW generator generates the action voltage VCW to be fed to the word line selector.

A memory array power supply VBU and VBL generator generates the action voltages VBU (on the high level side) and VBL (on the low level side) to be fed to the sense amplifiers. These sense amplifiers are activated with the voltages VBU and VBL to determine the high level and the low level of bit lines BL and /BL, so that the voltages to be written in the memory capacitors of the memory cells are made to correspond to the voltages VBU and VBL. The voltage VBL may be the ground potential VSS of-the circuit or the voltage which is shifted to the high level with respect to the ground potential of the circuit. When the low level of the bit lines is thus offset, the gate and the source of the address select MOSFET Qm are reversely biased if the nonselect level of the word lines is at the low level such as the ground potential. Without any application of the back bias VBB to the substrate on which the address select MOSFETs are formed, the leakage current flowing between the drain and source can be reduced by raising the effective threshold voltage even when the gate and the source are at the same potential.

The substrate voltage VBB generator generates the negative back bias voltage VBB to be fed to either the P-type substrate over which the address select MOSFETs of the memory cells are formed, or the P-type well region. When the bit line potential is set at a higher level than the select level of the word lines to provide the offset, the substrate voltage VBB generator can be omitted. The memory cell plate power supply VPL generates the plate voltage VPL to be fed to the common electrodes of the memory capacitors of the memory cells. This voltage is set at an intermediate value between the VBU and VBL of the bit lines, although the invention is not especially limited thereto. The bit line feeding internal power supply VMP generates the precharge voltage VMP to be fed to the complementary bit lines. When the plate voltage VPL is set at the intermediate value between the VBU and VBL of the bit lines, as described above, the voltage VMP is equal to the plate voltage VPL. In other words, the voltages VPL and VMP may be generated by passing the voltage generated by the same voltage generator through different output circuits.

The switching circuit generates a switching signal VBi for switching the normal mode/the aging mode. This switching circuit may be made to generate the signal VBi by monitoring the power supply voltage VCC and detecting that the potential is raised to an aging high voltage not less than the normal action supply voltage, or by setting a command for designating the aging mode in a built-in register. The signal VBi is fed to the word line boosting power supply VCW generator and the memory array power supply VBU VBL generator to switch the voltage VCW or VBU to a high voltage according to the rise in the power supply voltage VCC.

Figure 8:
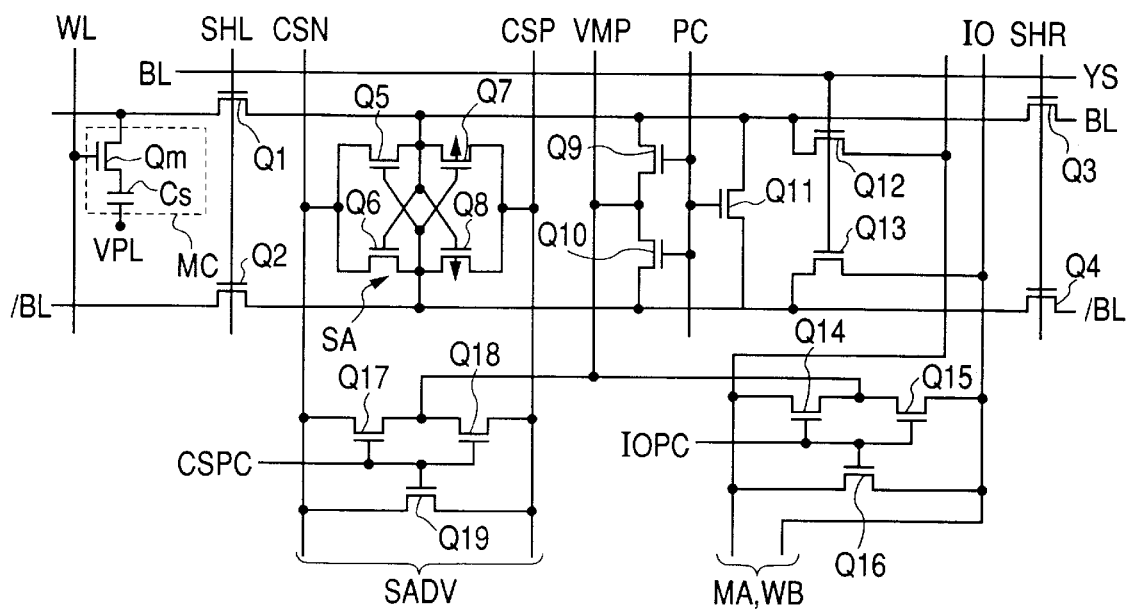
FIG. 8 is a schematic circuit diagram of an essential portion for explaining one embodiment of a dynamic RAM according to the invention.

FIG. 8 is a schematic circuit diagram of an essential portion for explaining one embodiment of the dynamic RAM according to the invention. In FIG. 8, there are representatively shown: a pair of bit lines BL and /BL; a word line WL; a dynamic memory cell MC disposed at the intersection of one complementary bit line BL and the word line WL; a sense amplifier SA disposed between the complementary bit lines BL or /BL; an equalize & precharge circuit and a shared select switch circuit for the bit lines, input/output lines and a common source line. The individual elements of FIG. 8 are designated by the same circuit symbols as those used in FIGS. 3 to 6, but should be understood to have different circuit functions individually.

At the intersection of the one complementary bit line BL and the word line WL, there is disposed the dynamic memory cell MC which comprises the address select MOSFET Qm and the memory capacitor Cs, as has been described hereinbefore. The bit lines BL and /BL are arranged in the memory mat provided on the lefthand side of the sense amplifier SA, and are connected through the shared select switch MOSFETs Q1 and Q2 with the input/output nodes of the sense amplifier SA which comprises the P-channel MOSFETs Q5 and Q6 and the N-channel MOSFETs Q7 and Q13. The input/output nodes of the sense amplifier are connected through the shared select switch MOSFETs Q3 and Q4 with the complementary bit lines BL and /BL provided on the righthand side. The lefthand select signal SHL is fed to the gates of the shared select switches Q1 and Q2, and the righthand select signal SHR is fed to the gates of the switch MOSFETs Q3 and Q4.

The input/output nodes of the sense amplifier are equipped with a bit line prechatrge circuit PCC which comprises the N-channel MOSFETs Q9, Q10 and Q11. N-channel MOSFETs Q17, Q18 and Q19 constitute a common source line precharge circuit for feeding the precharge voltage to the common source lines CSN and CSP of the sense amplifier SA, that is, the power supply feed lines CSN and CsP fed with the action voltages VBU and VBL. The input/output nodes of the sense amplifier SA are connected through the column select switch MOSFETs Q12 and Q13 with complementary input/output lines IO. These complementary input/output lines IO are also equipped with the equalize & precharge circuit which comprises the N-channel MOSFETs Q14 to Q16. This equalize & precharge circuit is commonly fed with the precharge voltage VMP and precharge signals PC, CSPC and IOPC corresponding to the individual precharge actions.

The select level of the word line WL and the select level of the lefthand select signal SHL or the righthand select signal-SHR are signals in accordance with the clock signal φ or a boost voltage SVWC generated in synchronism with the one-shot pulse 1φ, as described hereinbefore. As a result, for this boosting period, the high level amplified by the sense amplifier SA, that is, the high level such as the voltage VBU fed to the common source line CSP is transmitted, as it is without any level loss, to a capacitor CQs via the path of the P-channel MOSFET Q7 of the sense amplifier—the shared select switch MOSFET Q1—the bit line BL—the address select MOSFET Qm, and thus the full write is executed.

Figure 9:
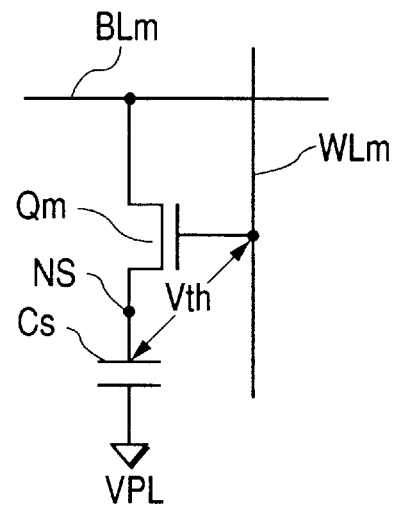
FIG. 9 is a circuit diagram showing one embodiment of a memory cell.
Figure 10:
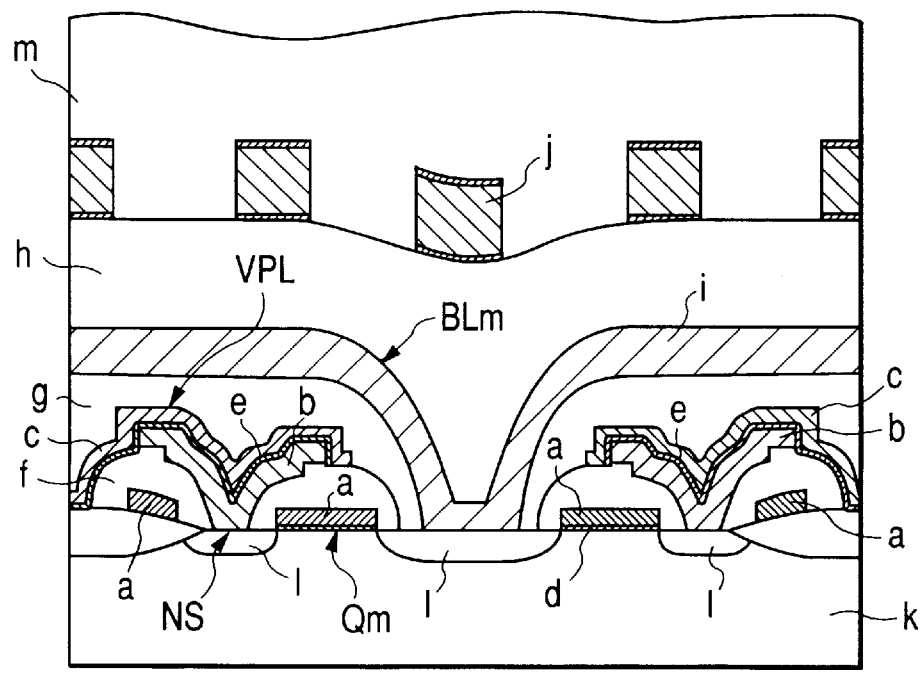
FIG. 10 is a schematic section of an element structure of a memory cell.

FIG. 9 is a circuit diagram showing one embodiment of the memory cell, and FIG. 10 is a schematic section of an element structure of the memory cell. The memory cell comprises the address select MOSFET Qm and the information memory capacitor Cs, as described hereinbefore. This information memory capacitor Cs is formed between the storage node NS and the plate (VPL). In a section of FIG. 10: symbol a designates a word line or a sub word line composed of a first polysilicon layer; symbol b designates the storage node NS composed of a second polysilicon layer; and symbol c designates a plate electrode composed of a third polysilicon layer. Moreover, symbol d designates a gate oxide film-of the MOSFET Qm, and symbol e designates an oxide film which is a dielectric body of the capacitor. Symbol f designates an oxide film (interlayer insulating film) formed between the first polysilicon layer and the second polysilicon layer.

In FIG. 10, symbol i designates a first metal layer constituting the bit line BLm. Symbol l designates an N-type diffusion layer forming the source and drain regions of the MOSFET, and the bit line BLm is connected with the N-type diffusion layer 1 which is shared between the address select MOSFETs constituting two memory cells. Symbol g designates an interlayer insulating film for insulating and isolating the plate electrode c and the first metal layer, and symbol h designates an interlayer insulating film for insulating and isolating the first metal layer and a second metal layer j to be formed over the former layer. Symbol k designates a P-type substrate or P-type well region fed with the aforementioned back bias voltage VBB. Symbol m designates a passivation film. By the aforementioned microminiaturization of the elements, the gate oxide film d is thinned, causing the problem that aging dielectric breakdown occurs due to the application of a high voltage for a long time.

Figure 11:
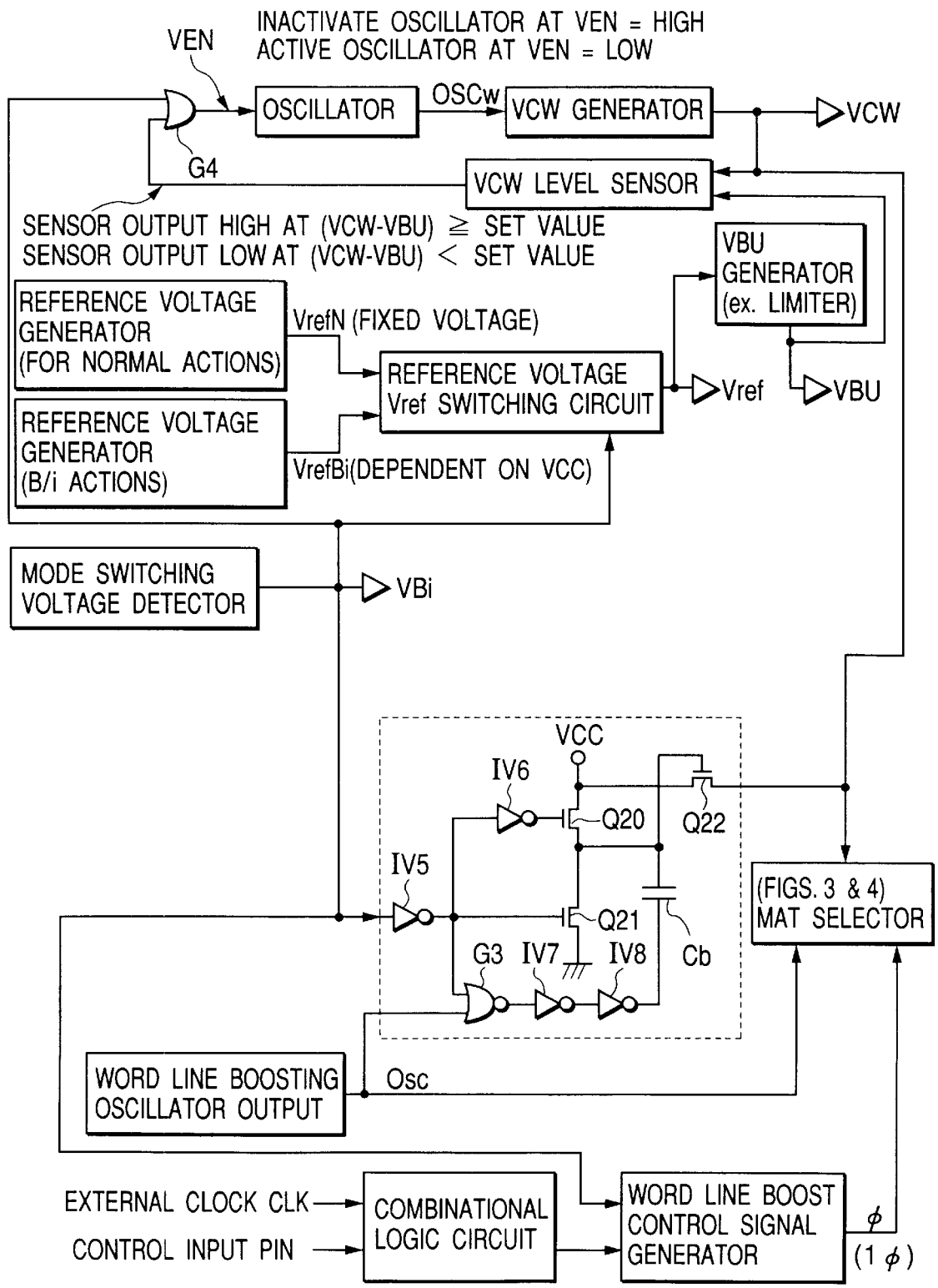
FIG. 11 is a block diagram showing one embodiment of the word line boosting power supply circuit of FIG. 7.

FIG. 11 is a block diagram showing one embodiment of the aforementioned word line boosting power supply circuit. The oscillator circuit generates periodic oscillation pulses OSCw. On receiving the oscillation pulses OSCw, the voltage VCW is generated by the VCW generator which comprises a charge pump circuit. In order to set this voltage VCW to a desired constant level, there is provided a VCW level sensor. This VCW level sensor raises a signal VEN, when the voltage VCW exceeds a set potential, to the high level through an OR gate circuit G4, thereby interrupting the oscillation of the oscillator. When the voltage VCW changes to where it is lower than a desired level, this drop is detected by the VCW level sensor to set the output signal VEN of the OR gate circuit G4 to the low level, thereby resuming the oscillation of the oscillator. By this control of the oscillation pulses OSCw, the charge pump circuit is intermittently activated to generate the desired constant voltage VCW. In short, the circuit described above constitutes a voltage regulator for generating a constant voltage from the external supply voltage.

In this embodiment, the word line boosting voltage is determined with reference to the memory array power supply VBU corresponding to the high level of the bit lines. In the VCW sensor, therefore, the voltage VCW is compared with the reference value which is prepared by adding a set value to the voltage VBU generated by the VBU generator., In short, the sensor output is set at the high level when VCW−VBU≧the set value, to raise the output VEN of the OR gate circuit G4 to the high level. When VCW−VBU<the set value, the sensor output is set: at the low level, thereby lowering the output VEN of the OR gate circuit G4 to the low level. These actions are performed in the normal mode in which the later-described mode switching signal VBi is at the low level.

The voltage generator described above is stabilized in its action because a constant voltage is produced independently of the power supply voltage VCC. The semiconductor integrated circuit device has to be aged or burned in so as to find the initial faults. When initial faults are found by activating the semiconductor integrated circuit device at a high temperature and at a high voltage, more specifically, the aforementioned constant voltage action has to be canceled to feed a high voltage. The constant voltage action in the normal mode and the aging action are switched with the signal VBi. This signal VBi is generated by the mode switching voltage detector. This mode switching voltage detector raises the signal VBi to the high level by detecting that the power supply voltage VCC is made sufficiently high with respect to the later-described normal action mode. In accordance with the high level of this signal VBi, the output VEN of the OR gate circuit G4 is raised to the high level so that the oscillator is always active to stop the oscillation of the pulses OSCW and thereby to bring the VCW oscillator into an interrupted state.

In the VBU voltage generator, a reference voltage Vref is switched to a reference voltage VrefBi having a dependence upon the power supply voltage VCC. For this switching of the action voltage of the word line selector or the like to the power supply voltage VCC, there is provided a switch circuit. This switch circuit comprises MOSFETs Q20 to QC22, inverters IV5 to IV8 and a NOR gate circuit G3. The signal VBi is fed to the input of the inverter IV5. At the burn-in time, therefore, the output signal of the inverter IV5 is set at the low level to turn off the MOSFET Q21 on the ground side, and the output signal of the inverter IV6 is raised to the high level to turn on the MOSFET Q20 on the power supply VCC voltage VCC side. As a result, the MOSFET Q22 is fed at its gate with the signal at the high level, and is turned on. The gate voltage of this MOSFET Q22 is employed as the boosted voltage by the bootstrap circuit which comprises the MOSFET Q22, a capacitor Cb and the inverter IV8.

In short, the oscillation pulses OSc fed from the output of the word line boosting oscillator feed the signals at the high/low levels to the capacitor Cb through the NOR gate circuit G3 whose gate is opened with the low level of the signal VBi, and through the inverters IV7 and IV8. When this signal is at the low level, the capacitor Cb is charged up with the power supply voltage VCC−Vth through the MOSFET Q20. When the signal is at the high level, the boosted voltage inverts the source and drain of the MOSFET Q20, and the power supply voltage VCC side acts as the source to limit the level to VCC+Vth. As a result, the power supply voltage VCC and the internal voltage VCW are equalized through the MOSFET Q22.

This voltage VCW is utilized as the action voltage VCW of the mat selector shown in FIG. 3 or FIG. 4. Upon receiving the clock signal CLK and the control signal of the controlling input pin, the combinational logic circuit decodes the read and write action modes, the CAS latency and the burst length from the combination of the control input pins to generate the pulse j or the one-shot pulse 10 selectively of the word line through the word line boost control signal generator. This signal ϕ or 1ϕ is interrupted with the high level of the signal VBi when in the aforementioned burn-in action.

Figure 20:
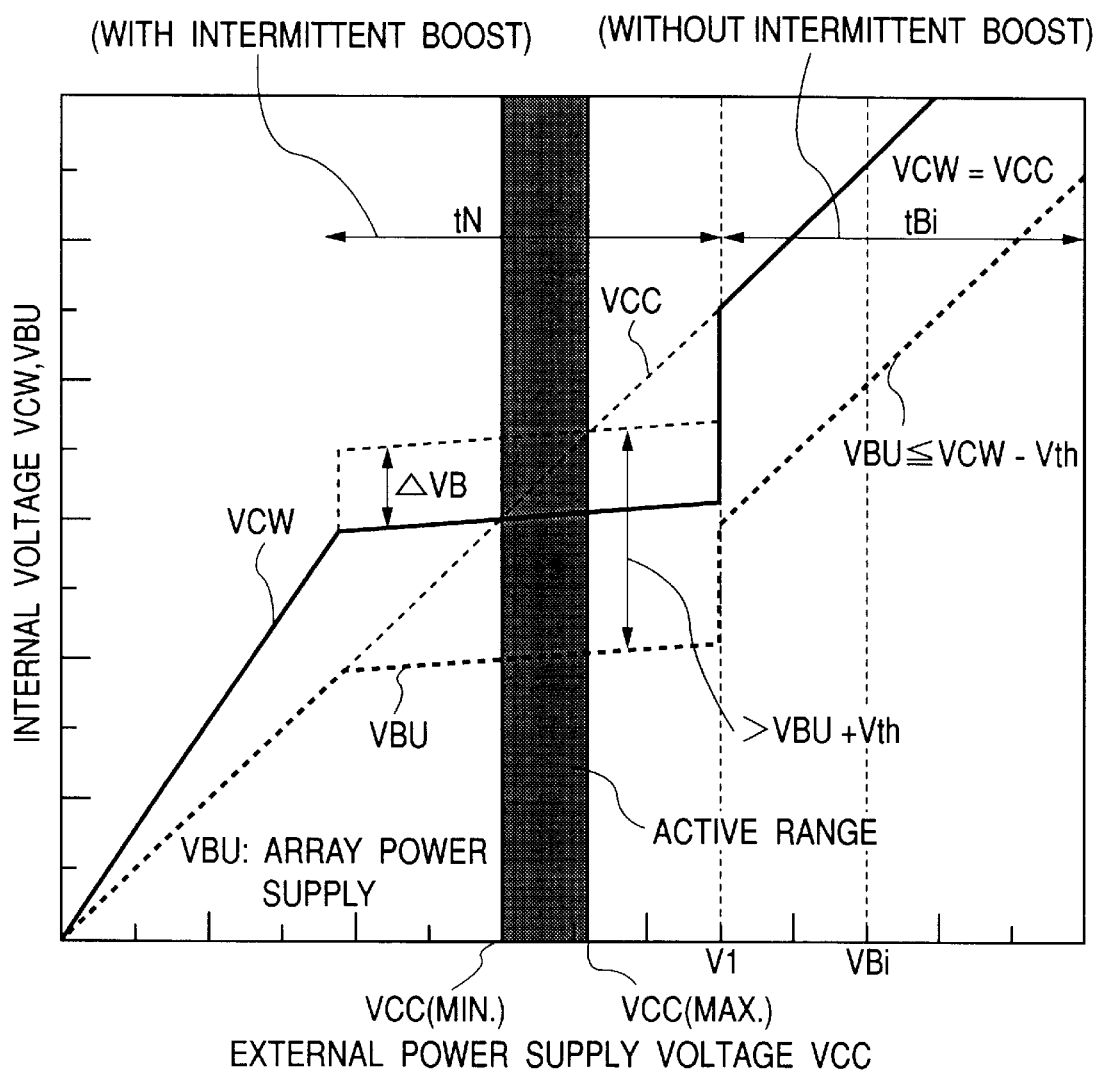
FIG. 20 is a voltage characteristic diagram of the embodiment of FIG. 11.

FIG. 20 is a voltage characteristic diagram of the embodiment ox FIG. 11. When the power supply voltage VCC is not more than a voltage V1, that is, when the power supply voltage VCC is in the region where the power supply voltage VCC is lower than the voltage V1 for discrimination, the mode is judged to be normal. The potential of the word line in this normal mode is first boosted to the voltage VCW which is further boosted by ΔVB by the pulse ϕ or 1ϕ, and boosted to a value higher by the threshold voltage Vth than the high level VBU of the bit lines. When the voltage VBU is made constant with respect to the power supply voltage VCC, the sense amplifier or the word line selector can act stably independently of the power supply voltage VCC. In the active range, moreover, the internal voltage VBU is lowered with respect to the power supply voltage VCC, so that the select level of the word line is set at a relatively low potential. The action at this low voltage is effective in realizing the low power consumption.

When the power supply voltage VCC is not less than the voltage Vi, that is, when the power supply voltage VCC is in the region where the power supply voltage VCC is higher than the voltage V1 for discrimination, the mode is judged to be burn-in. In this burn-in mode, the voltages VCW and VCC are equalized if the actual burn-in voltage VBi is fed, and the reference voltage VreBi is so switched to equalize the sum of VBU+Vth to VCW (VCC).

Figure 12:
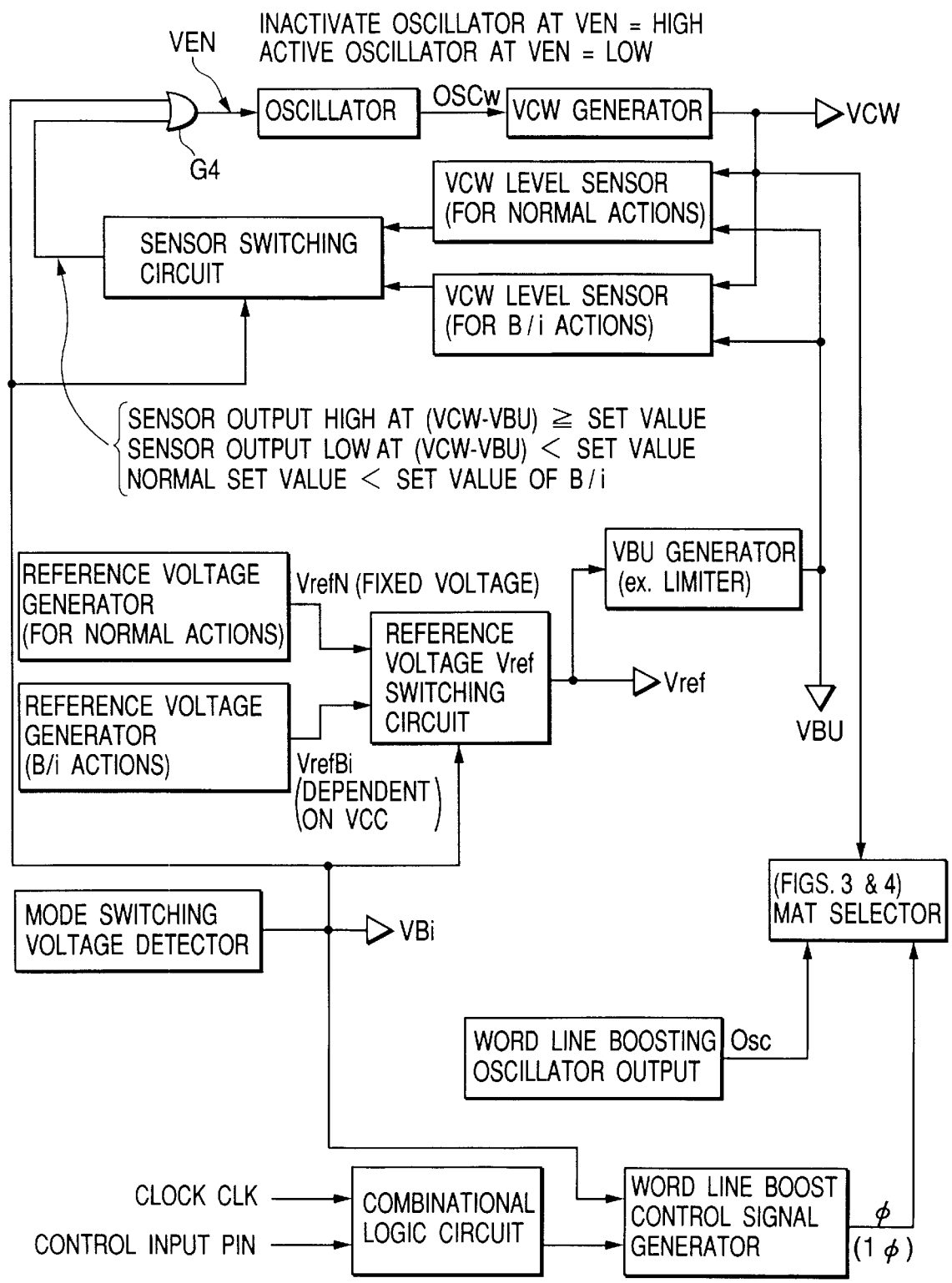
FIG. 12 is a block diagram showing another embodiment of the word line boosting power supply circuit of FIG. 7.

FIG. 12 is a block diagram showing another embodiment of the word line boosting power supply circuit. In this embodiment, the voltage VCW generated by the VCW generator is utilized in the burn-in mode, too. In this burn-in mode, the voltage generated by the VCW generator is not switched, unlike in the embodiment of FIG. 11, to the power supply voltage VCC by the switch circuit, but is utilized as it is. In other words, the switch circuit of FIG. 11 is omitted from the embodiment of FIG. 12 and is replaced by an additional VCW level sensor (for the Bi action) and the sensor switching circuit. In the burn-in mode, the oscillator is controlled with the output of the VCW level sensor (for the Bi action) by the sensor switching circuit, thereby generating the internal voltage VCW which changes in accordance with the voltage VBU.

Figure 21:
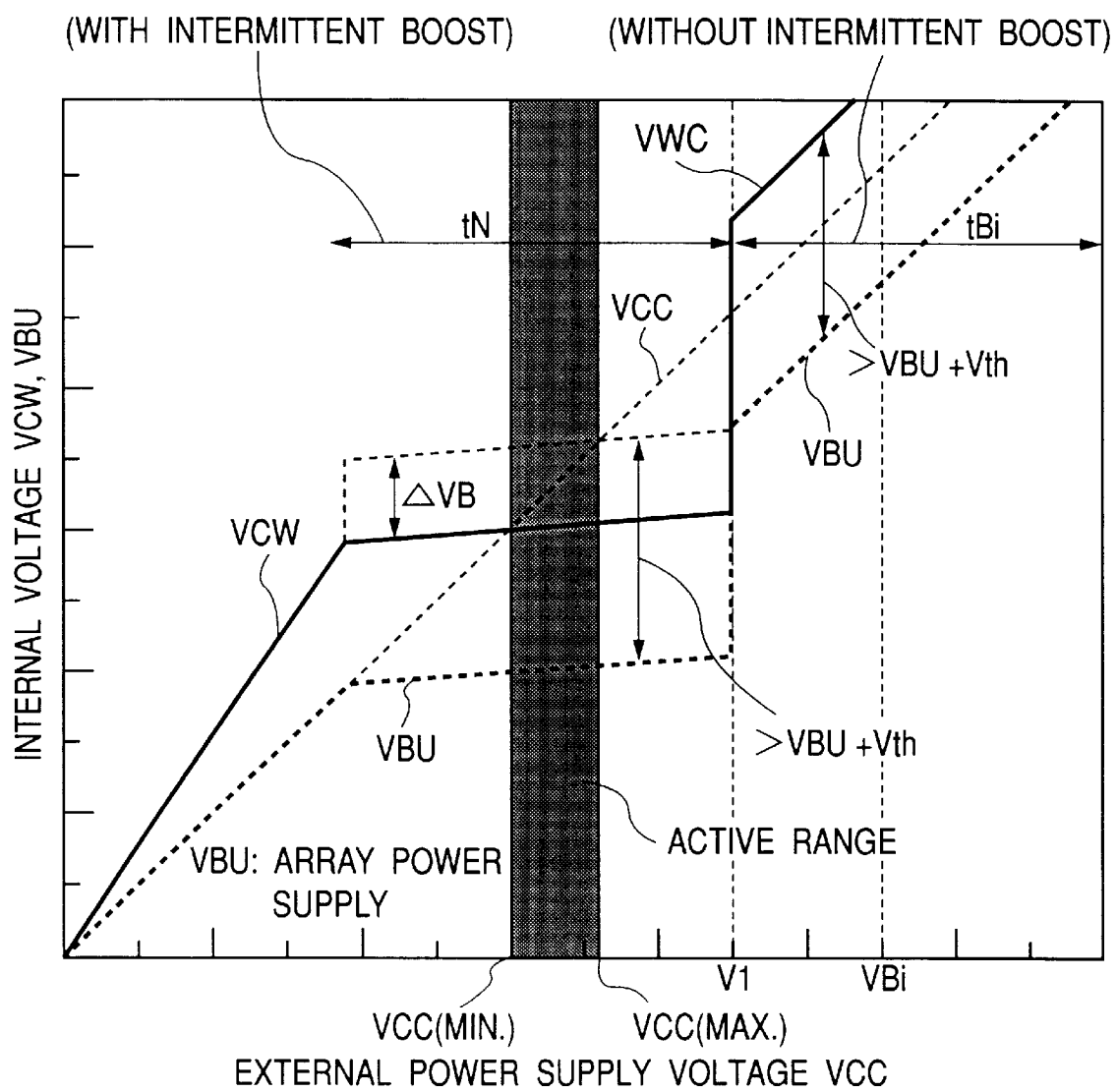
FIG. 21 is a voltage characteristic diagram of the embodiment of FIG. 12.

FIG. 21 is a voltage characteristic diagram of the embodiment of FIG. 12. When the power supply voltage VCC is not more than a voltage V1, that is, when the power supply voltage VCC is in the region where the power supply voltage VCC is lower than the voltage V1 for discrimination, the mode is judged to be normal. In this normal mode, the individual voltages are similar to those of FIG. 20 (the circuit of FIG. 11).

When the power supply voltage VCC is not less than the voltage V1, that is, when the power supply voltage VCC is in the region where the power supply voltage VCC is higher than the voltage V1 for discrimination, the mode is judged to be burn-in. In this burn-in mode, the voltage VBU changes in accordance with the power supply voltage VCC, and the voltage VCW is generated for the voltage VBU, and the voltage VCW also changes in accordance with the power supply voltage VCC. In this case, the set value of the VCW level sensor is made larger than the set value when the Bi set value is normal.

Figure 13:
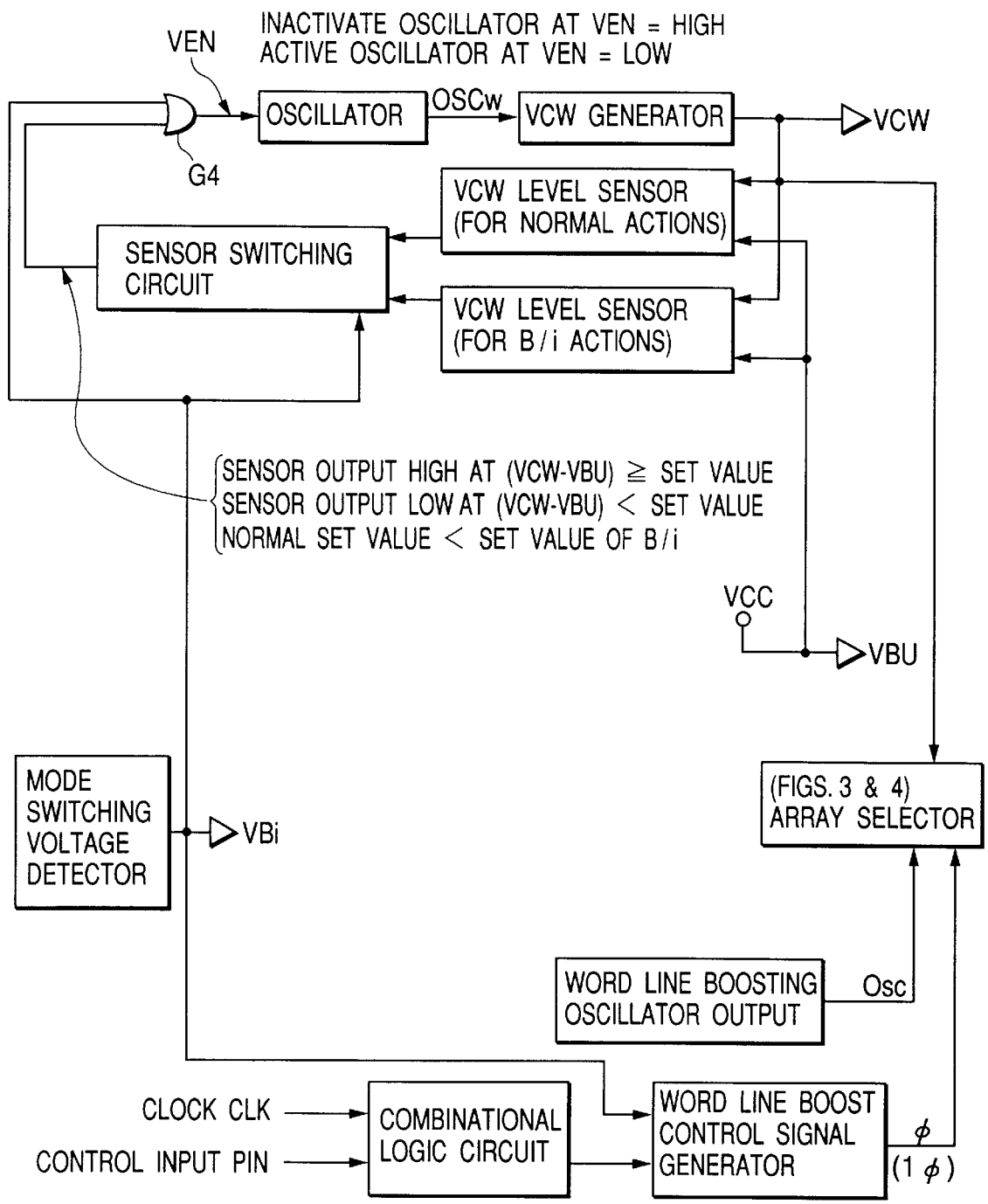
FIG. 13 is a block diagram showing still another embodiment of the word line boosting power supply circuit of FIG. 7.

FIG. 13 is a block diagram showing still another embodiment of the word line boosting power supply circuit. In this embodiment, the internal voltage VBU and the power supply voltage VCC are equalized, and the power supply voltage VCC is utilized as it is as the action voltage of the sense amplifier. Therefore, the VBU voltage generator of FIG. 12 is omitted, and accordingly the reference voltage generator and switch circuit are eliminated. The remaining constructions are similar to those of FIG. 12.

Figure 22:
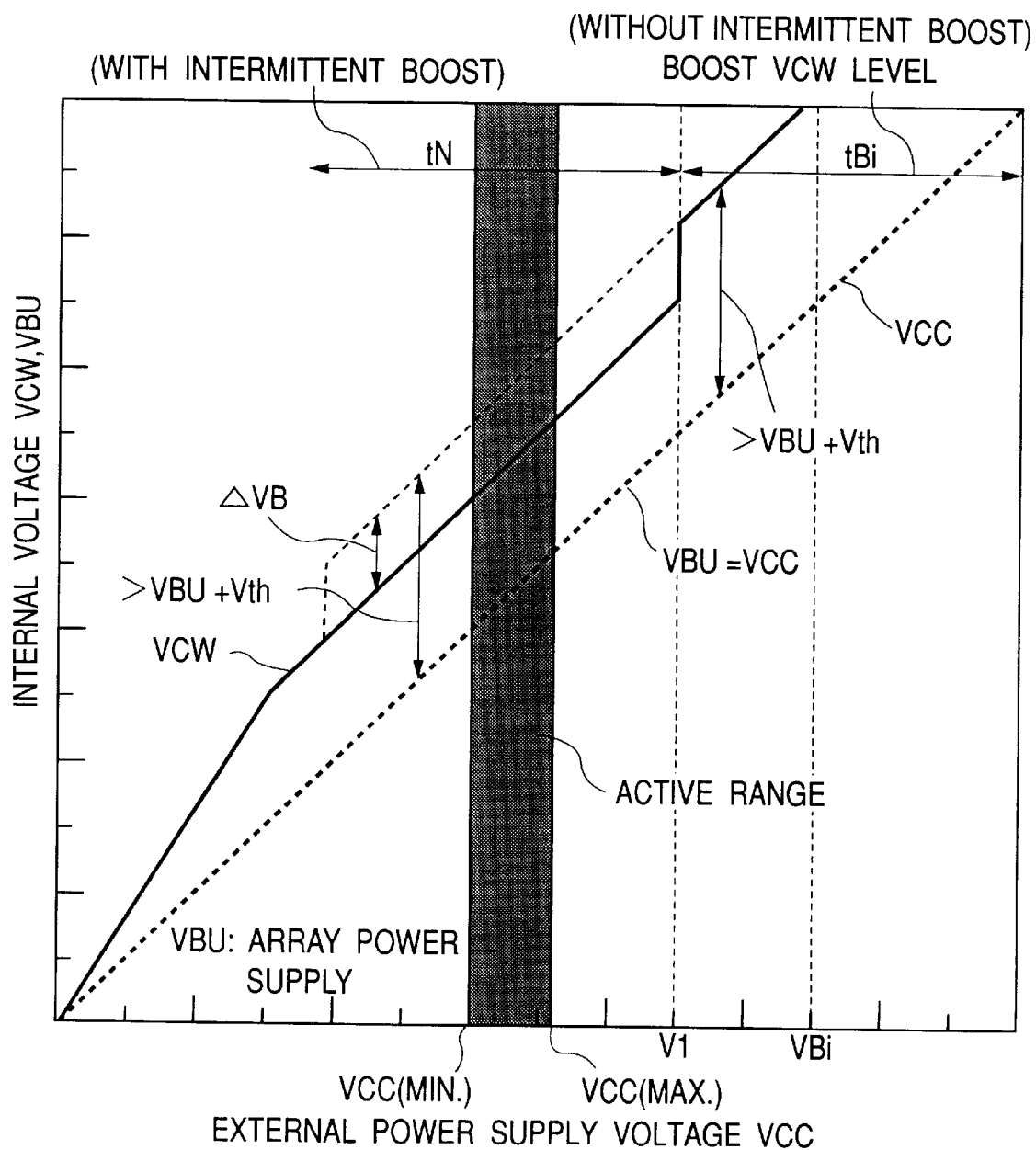
FIG. 22 is a voltage characteristic diagram of the embodiment of FIG. 13.

FIG. 22 is a voltage characteristic diagram of the embodiment of FIG. 13. When the power supply voltage VCC is not more than a voltage V1, that is, when the power supply voltage VCC is in the region where the power supply voltage VCC is lower than the voltage Vl for discrimination, the mode is judged to be normal. Of the individual voltages in this normal mode, the voltage VCW is generated according to the power supply voltage VCC, so that the voltage of the word line is boosted by ΔVB for the voltage VCW in synchronism with ϕ or 1ϕ.

When the power supply voltage VCC is not less than the voltage V1, that is, when the power supply voltage VCC is in the region where the power supply voltage VCC is higher than the voltage V1 for discrimination, the mode is judged to be burn-in. In this burn-in mode, the voltage VCW steadily acts on the burn-in action which is performed by the voltage boosted with respect to the power supply voltage VCC. In this case, too, the set value of the VCW level sensor is made higher than when the Bi set value is normal.

Figure 23:
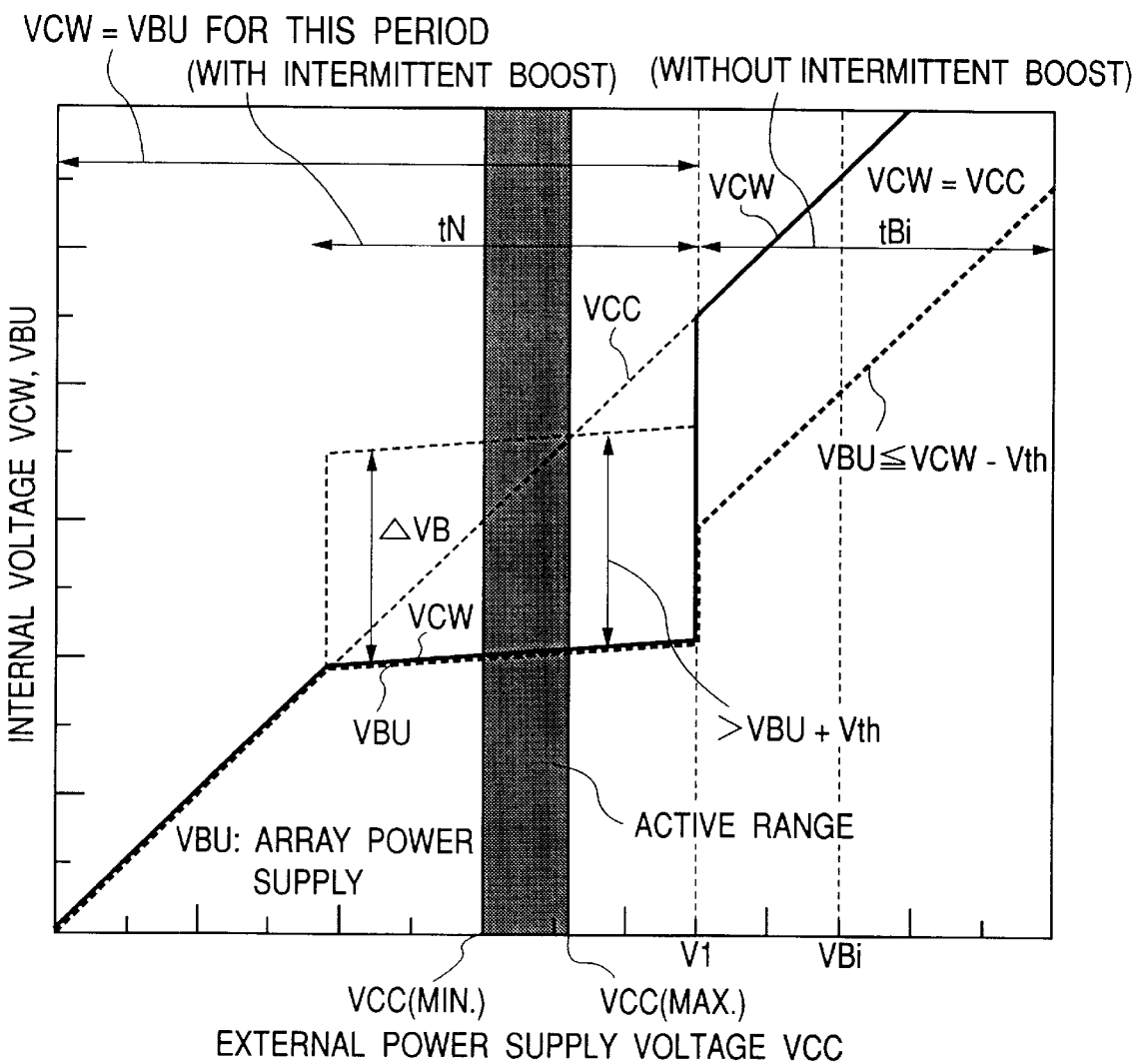
FIG. 23 is a voltage characteristic diagram for explaining another embodiment of the invention.

FIG. 23 is a voltage characteristic diagram of another embodiment. In the circuit of this embodiment, the internal voltage VBU and the voltage VCW are equalized, although not shown. In the word line booster, more specifically, the voltage is boosted by a voltage corresponding to the threshold voltage Vth of the MOSFETs with reference to the voltage VBU. When the power supply voltage VCC is not more than a voltage V1, that is, when the power supply voltage VCC is in the region where the power supply voltage VCC is lower than the voltage V1 for discrimination, the mode is judged to be normal. In this normal mode, the individual voltages are set to VBU=VCW, and the voltage of the word line is boosted by Vth with respect to the voltage VCW in synchronism with ϕ or 1ϕ.

When the power supply voltage VCC is not less than the voltage V1, that is, when the power supply voltage VCC is in the region where the power supply voltage VCC is higher than the voltage V1 for discrimination, the mode is judged to be burn-in. In this burn-in mode, the voltage VCW is equalized to the voltage VCC, and the voltage VBU is produced by lowering the voltage VCW by the threshold voltage Vth. That is, VBU=VCW(VCC)−Vth.

Figure 24:
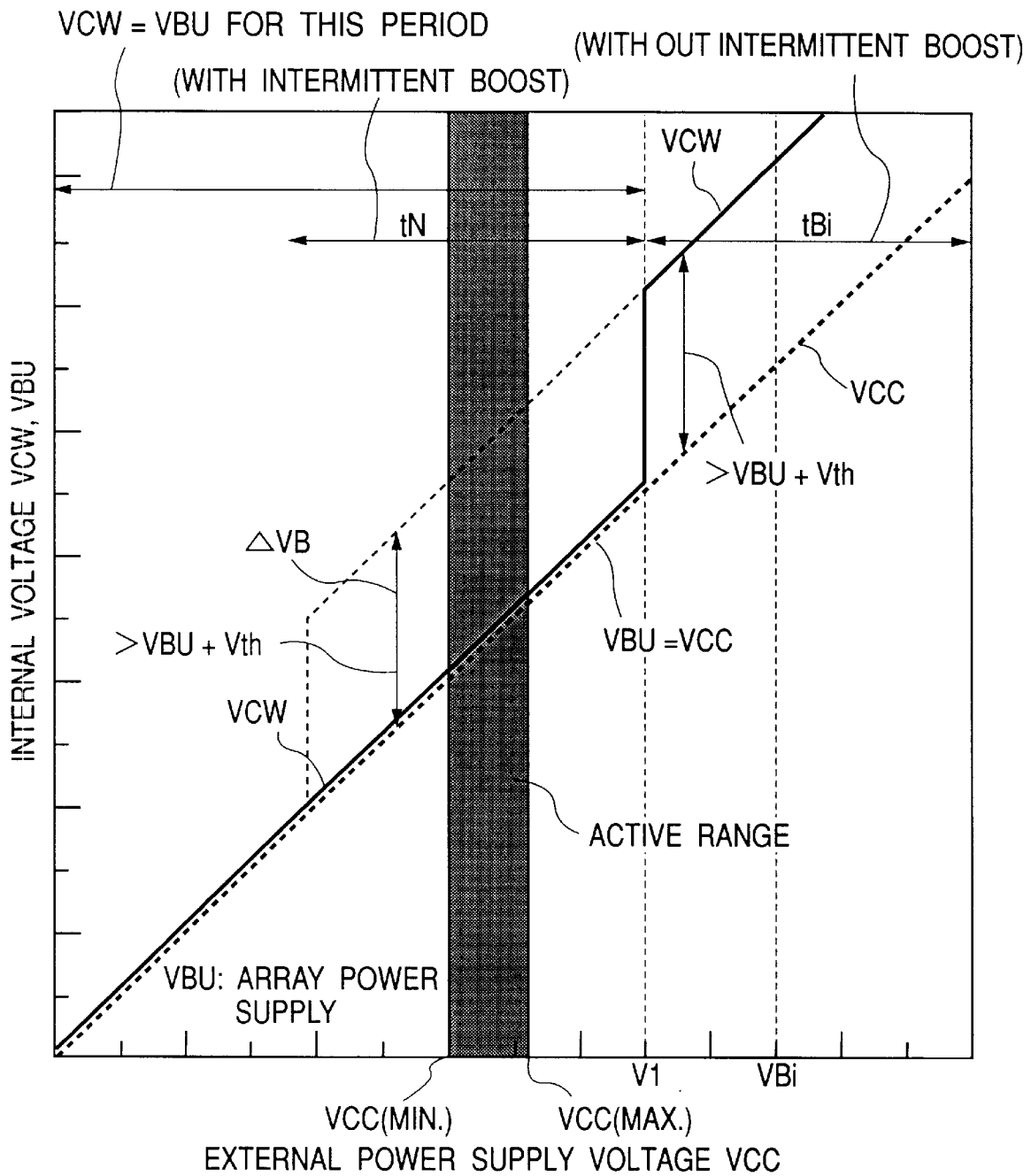
FIG. 24 is a voltage characteristic diagram for explaining still another embodiment of the invention.

FIG. 24 is a voltage characteristic diagram of still another embodiment. In the circuit block of this embodiment, the internal voltage VBU, the voltage VCW and the voltage VCC are equalized, although not shown. The embodiment of FIG. 13 may be partially modified so that a voltage equal to the voltage VBU (or VCC) may be generated by the VCW generator. The word line generator boosts the voltage by the threshold voltage Vth of the MOSFETs with reference to the power supply voltage VCC. When the power supply voltage VCC is not more than a voltage V1, that is, when the power supply voltage is in the region where the power supply voltage VCC is lower than the voltage V1 for discrimination, the mode is judged to be normal. In this normal mode, the individual voltages are set to VBU= VCW=VCC, and the voltage of the word line is boosted by Vth with respect to the voltage VCC in synchronism with φ or 1φ.

When the power supply voltage VCC is not less than the voltage V1, that is, when the power supply voltage is in the region where the power supply voltage VCC is higher than the voltage V1 for discrimination, the mode is judged to be burn-in. In this burn-in mode, the VCW level sensor is switched, so that the VCW generator generates a boosted voltage equalized to VCC+Vth. In the burn-in mode, therefore, the boosted select level VCW can be applied to the selected word line for a selected period, thereby applying a sufficient stress to the address select MOSFET.

Figure 14:
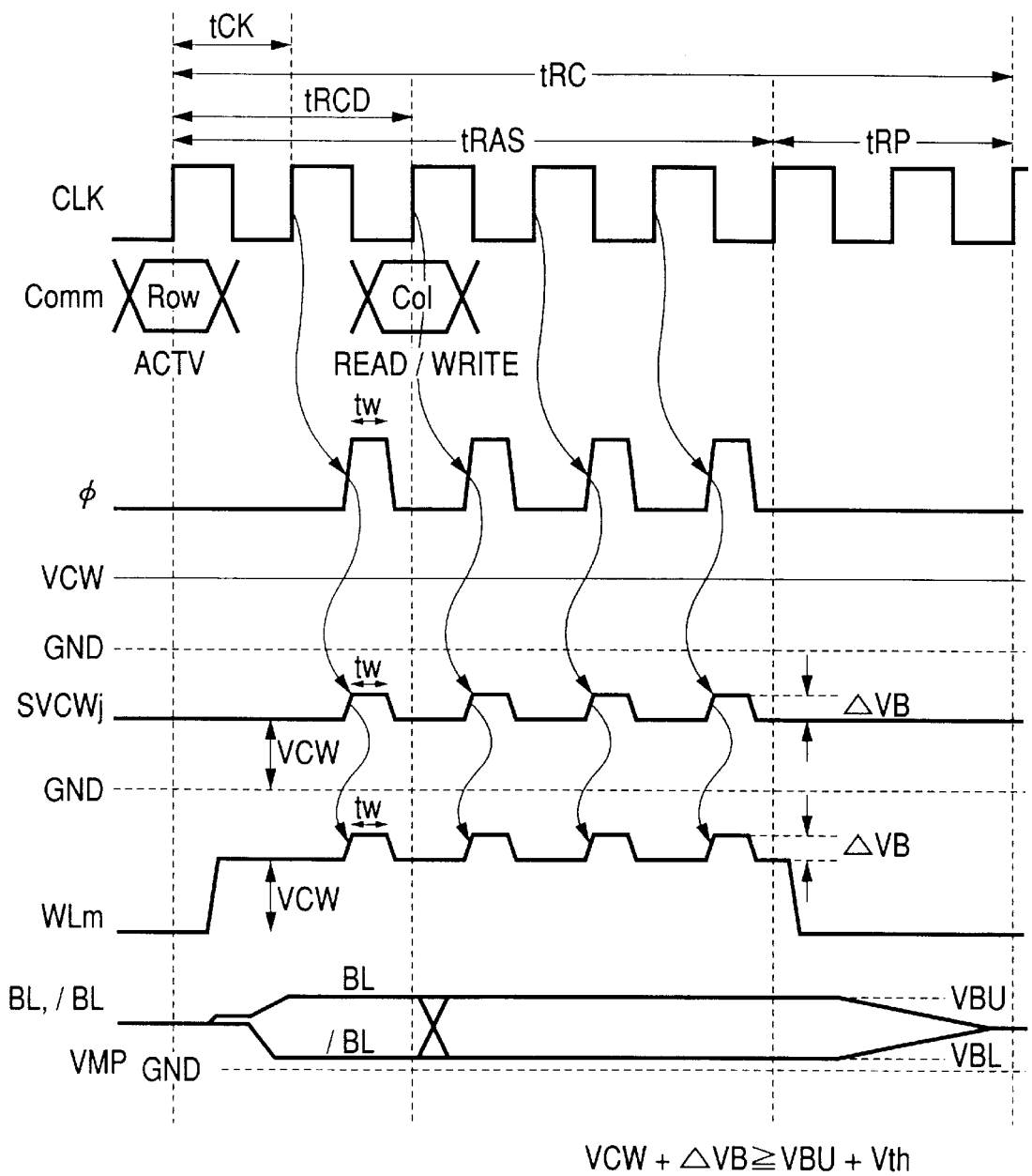
FIG. 14 is a timing chart for explaining the actions of the embodiment of FIG. 3.

FIG. 14 is a timing chart for explaining the action of the embodiment of FIG. 3. In synchronism with the clock signal CLK, a command Comm and a row address signal Row, composed of combined control signals, are fetched to select the word line WLm. After this word line WLm is selected, the pulse φ is generated in synchronism with the clock signal CLK, and the word line booster acts to boost the sub power supply line SVCWj intermittently by VCW+ΔVB. For this period tw, the capacitors of the memory cells are fully written.

After two clocks from the fetch of the row address Row, a column address Col is fetched. When the mode is the write mode, the potentials of the complementary bit lines BL and /BL are changed with the wrote signal which is inputted in synchronism with the column address, and the full write is executed when receiving a next clock. In this embodiment, the period for which the maximum field intensity is applied to the word line WLm is shortened at least to tw/tCLK. Here, symbol tCLK designates one period of the clock signal CLK. As a result, it is possible to prevent aging dielectric breakdown of the gate oxide film. This construction can be simply realized because the pulse φ only has to be generated while the word line is selected.

Figure 15:
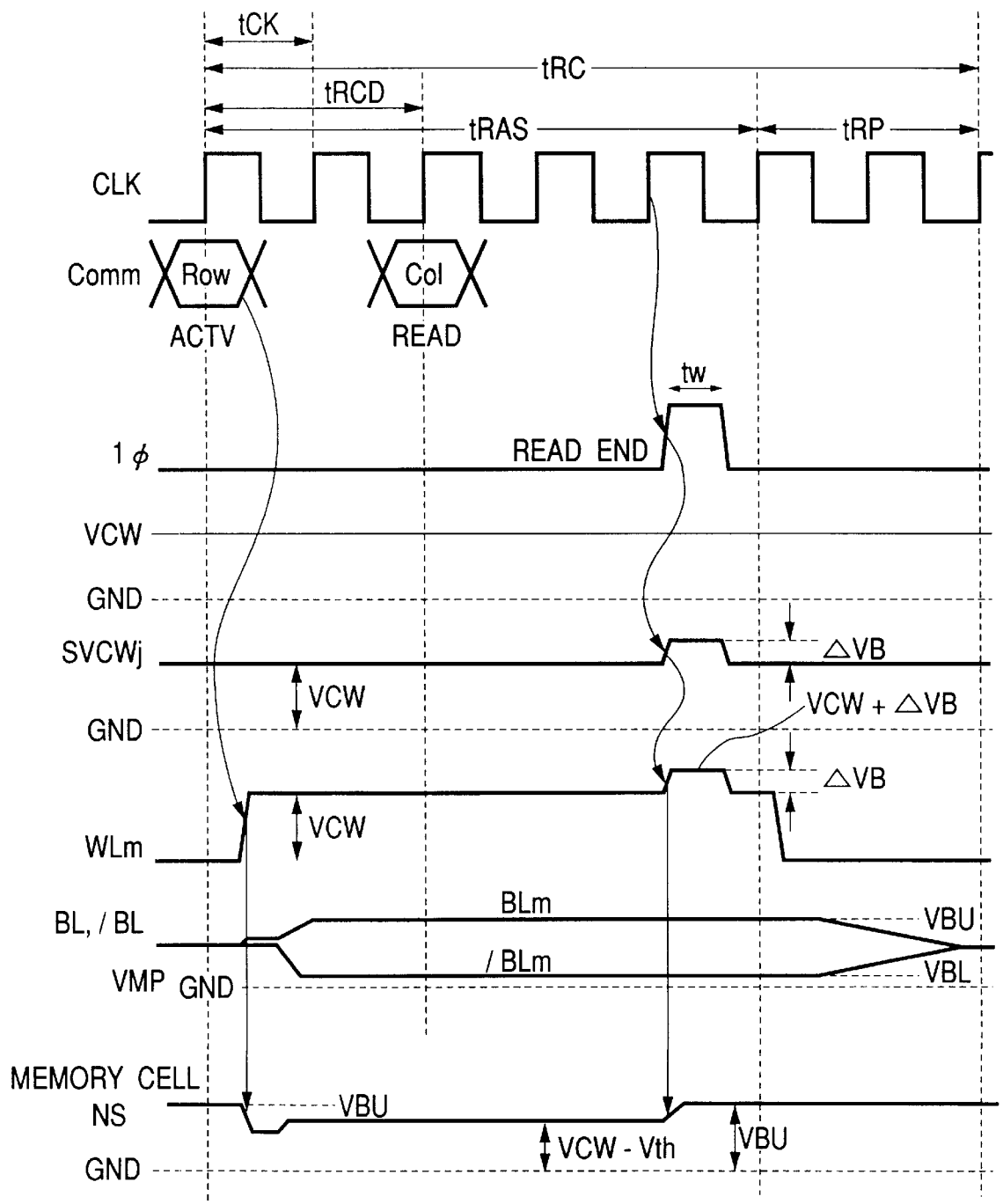
FIG. 15 is a timing chart for explaining the reading actions of the embodiment of FIG. 4.

FIG. 15 is a timing chart for explaining the action of the embodiment of FIG. 4. In synchronism with the clock signal CLK, like before, the row address signal Row is fetched to select the word line WLm. In this embodiment, unlike the action shown in FIG. 14, a plurality of pulses φ are not generated after the selection of the word line WLm in synchronism with the clock signal CLK, but a single pulse 1φ is generated at the end of the read cycle (Read End) immediately before the start of the precharge. Before the generation of the pulse 1φ, the potential of the storage node NS of the memory cells is held at VCW−Vth, which is lower than the high level VBU of the bit line. In synchronism with the pulse 1φ, moreover, the word line booster is activated to set the potential of the storage node NS of the memory cell at the high level VBU of the bit line BLm.

Figure 16:
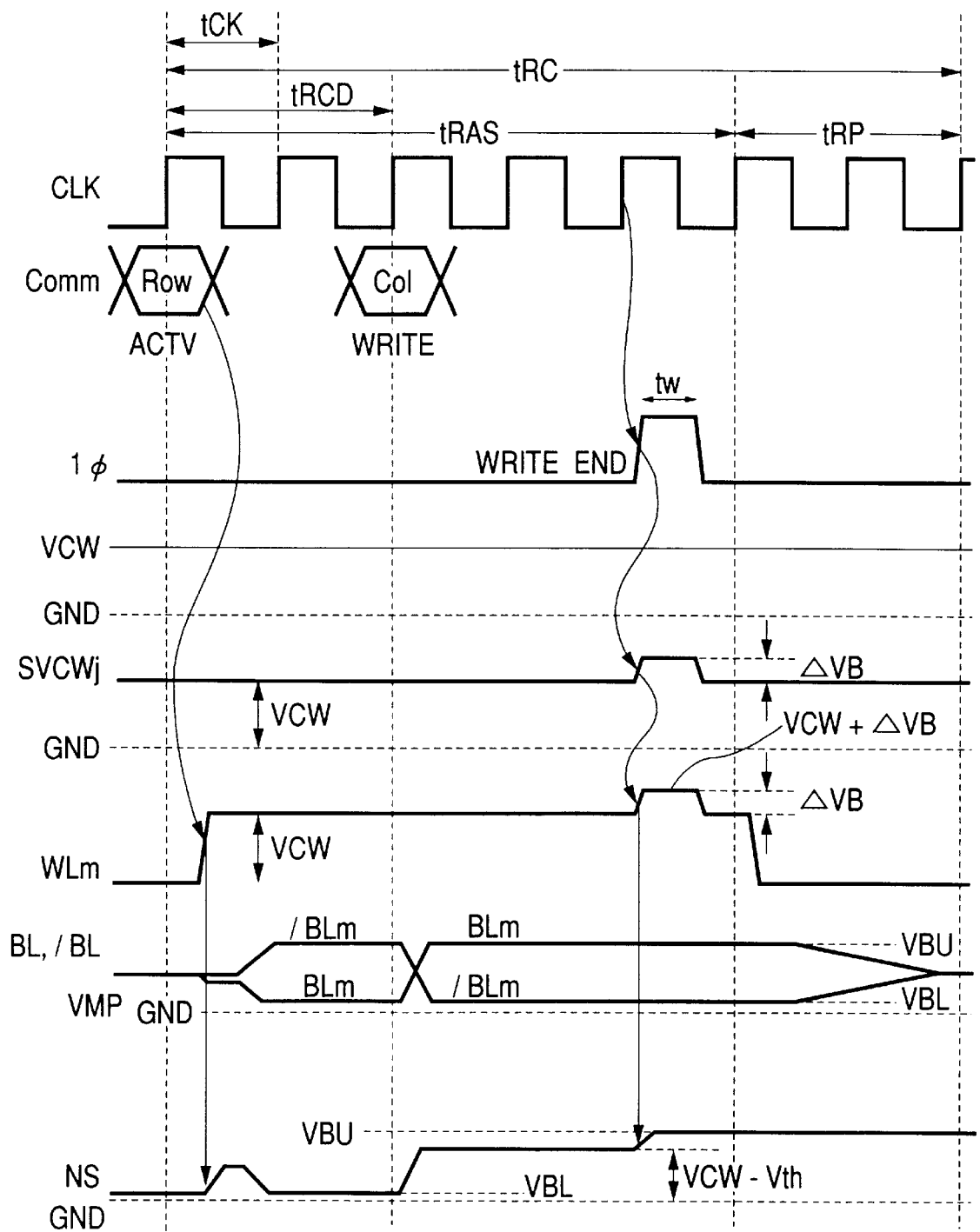
FIG. 16 is a timing chart for explaining the writing actions of the embodiment of FIG. 4.

FIG. 16 is a timing chart for explaining the action of the embodiment of FIG. 4. In synchronism with the clock signal CLK, like before, the row address signal Row is fetched to select the word line WLm. There is no CAS latency in the write action unlike the foregoing actions, so that the fetch of the write data is started from the column address/write command cycle. As a result, one pulse 1φ is generated at the end of the write cycle (Write End) immediately before the start of the precharge after the data fetch. Before the pulse 1φ is generated, the potential of the storage node NS of the memory cell is held at the level of VCW−Vth which is lower than the high level VBU of the bit line corresponding to the write data. In synchronism with the pulse 1φ, moreover, the word line booster is activated to set the potential of the storage node NS of the memory cell at the high level VBU of the bit line BLm.

In the aforementioned read action and write action of this embodiment, the period tw for which the maximum field intensity is applied to the word line is extremely shortened to tw/tRAS, which is far shorter than the active period (tRAS) of the memory cells. Moreover, the word line is boosted for the active period of the memory cells before a precharge period tRP, so that the memory cycle is not prolonged. The word line is boosted in synchronism with the aforementioned one pulse. For the precharge period for which the word line WLm is reset at the low level, the potential of the word lines is not reset from the boosted voltage to the low level, but may be set from the action voltage VCW to a level as low as the ground potential of the circuit, so that the resetting action of the word line can be speeded up. Moreover, the electric current consumed in selecting/nonselecting the word line can be reduced to the one consumed in precharging/discharging the voltage VCW of the word line.

Figure 17:
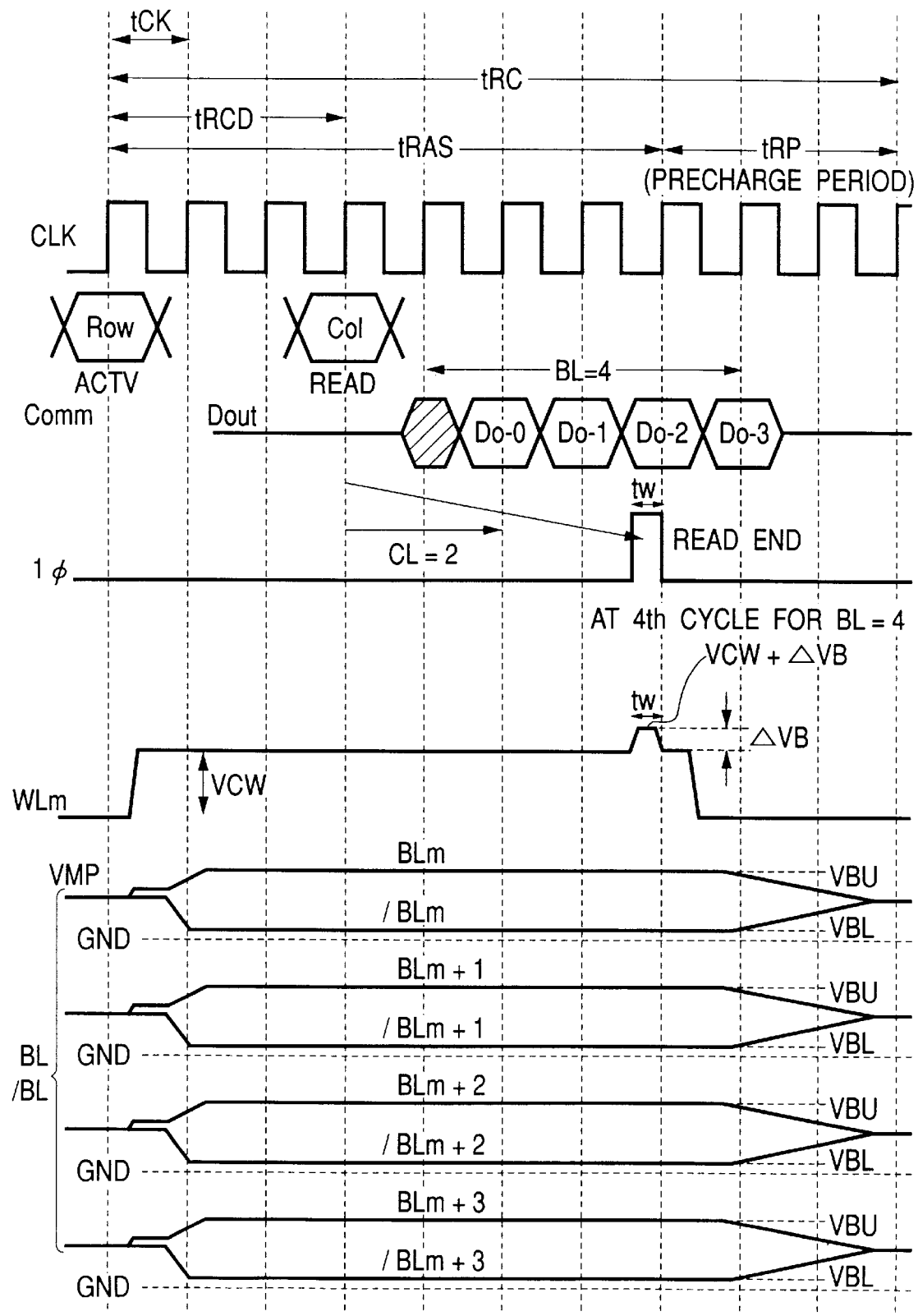
FIG. 17 is a timing chart for explaining the reading actions of the embodiment of FIG. 4.

FIG. 17 is a timing chart for explaining the reading action of the embodiment of FIG. 4. In this embodiment, the burst read is designated. A CAS latency (CL) indicates how many cycles of the internal clock signal are consumed in the read action ordered by the column address/read command, from the fall of the /CAS to the outputting action of the output buffer 211. FIG. 17 shows the case in which CL=2 and the burst length BL is specified as 4. In this burst read mode, the third and fourth data outputting actions are performed for the precharge period tRP, so that the pulse 1φ is generated at the preceding fourth cycle from the fall of the /CAS, for example. In synchronism with this pulse 1φ, the rewrite action of all the memory cells connected with the selected word line WLm is performed together.

Figure 18:
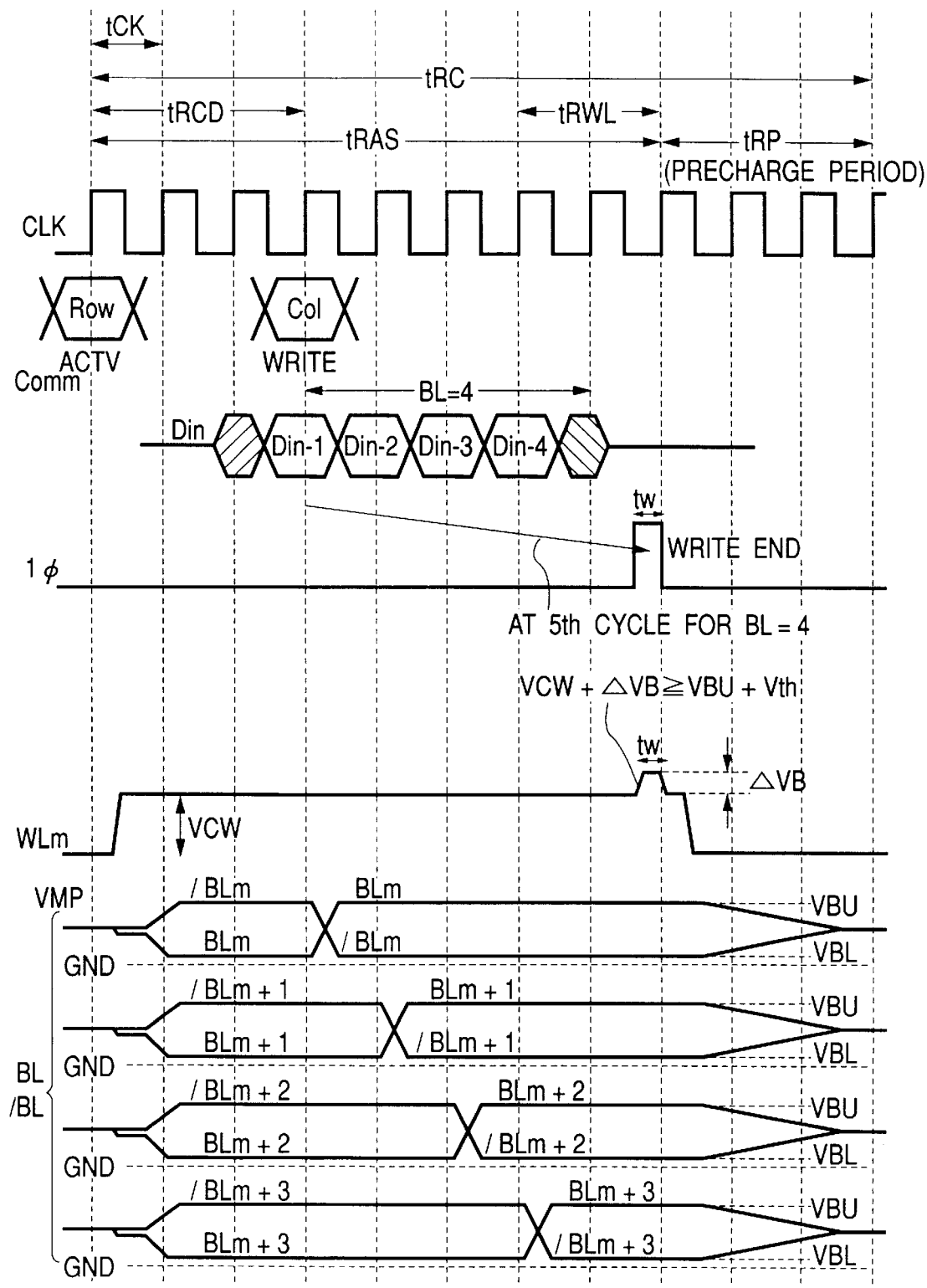
FIG. 18 is a timing chart for explaining the writing actions of the embodiment of FIG. 4.

FIG. 18 is a timing chart for explaining the writing action of the embodiment of FIG. 4. In this embodiment, the burst write is designated and the burst length BL=4. For fetching the write data, there are inputted write data Din-1 to Din-4 over four cycles from the column address/write command cycle. Since the word line has to be boosted after the input of the write data Din-4 at the fourth cycle, the pulse 1φ is generated at the fifth cycle when BL=4 as in before. In synchronism with this pulse 1φ, the potential of the selected word line WLm is raised to VBU+Vth, so that the rewrite action of the memory cells is performed together.

Figure 19:
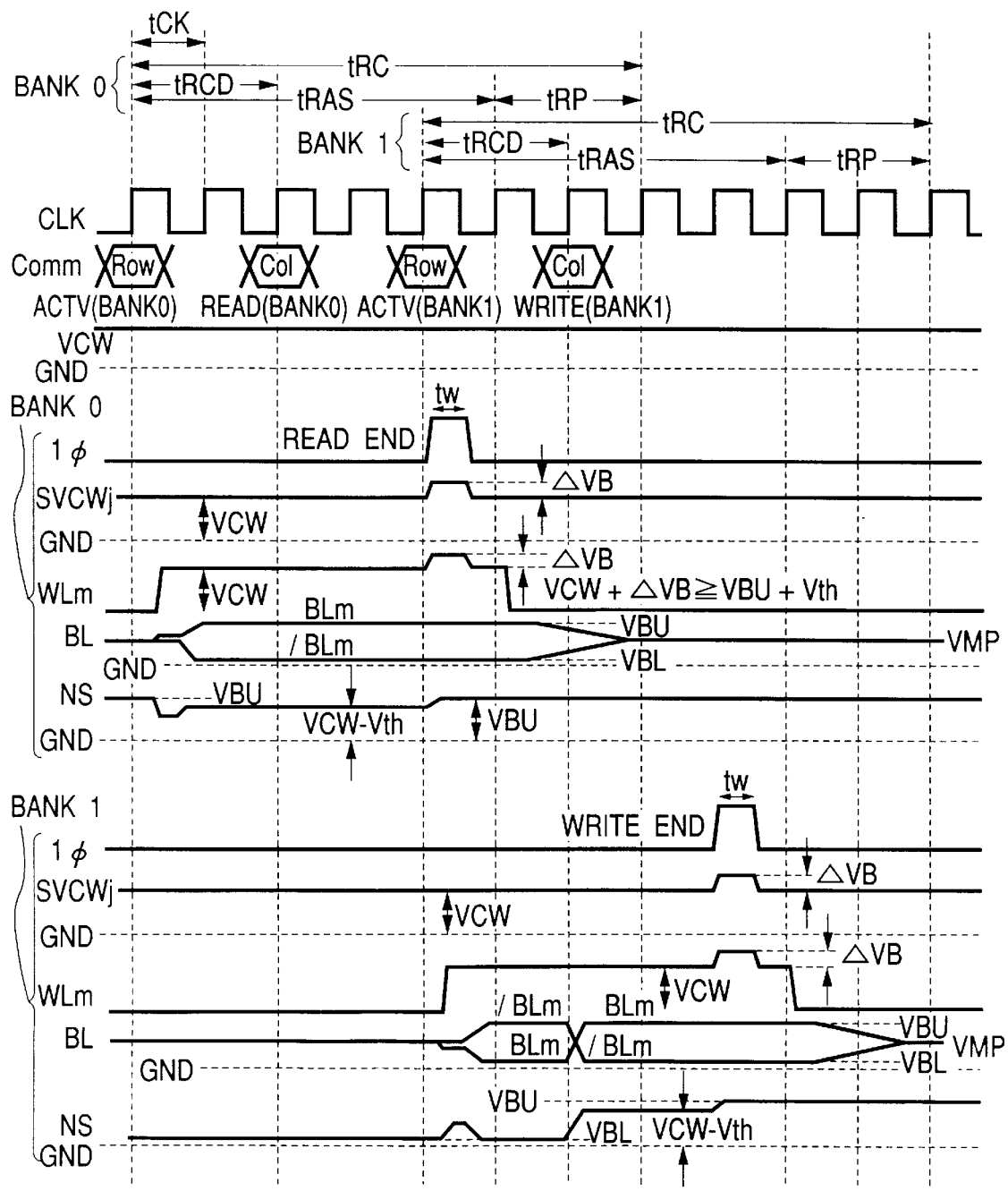
FIG. 19 is a timing chart for explaining the reading actions of over two banks of the embodiment of FIG. 4.

FIG. 19 is a timing chart for explaining the reading action of the embodiment of FIG. 4. over two banks. In an SDRAM, accesses to the memory cells of the two memory banks can be made separately, as described hereinbefore. Specifically, the read command is executed by designating the bank 0, and the bank 1 is designated during the execution, to input the commands and addresses. In other words, the last cycle of the memory cycle tRAS of the bank 0 and the first cycle of the memory cycle tRAS of the bank 1 are executed in an overlapping manner. At the time of thus accessing the two banks, the individual memory banks can be separately accessed, as described above, the read end is detected in a manner to match correspondingly to the CAS latency and the burst length when the mode is the read mode in the individual banks and the pulse 1 is generated. In the shown example, the bank 0 is read, and the bank 1 is written.

Figure 25:
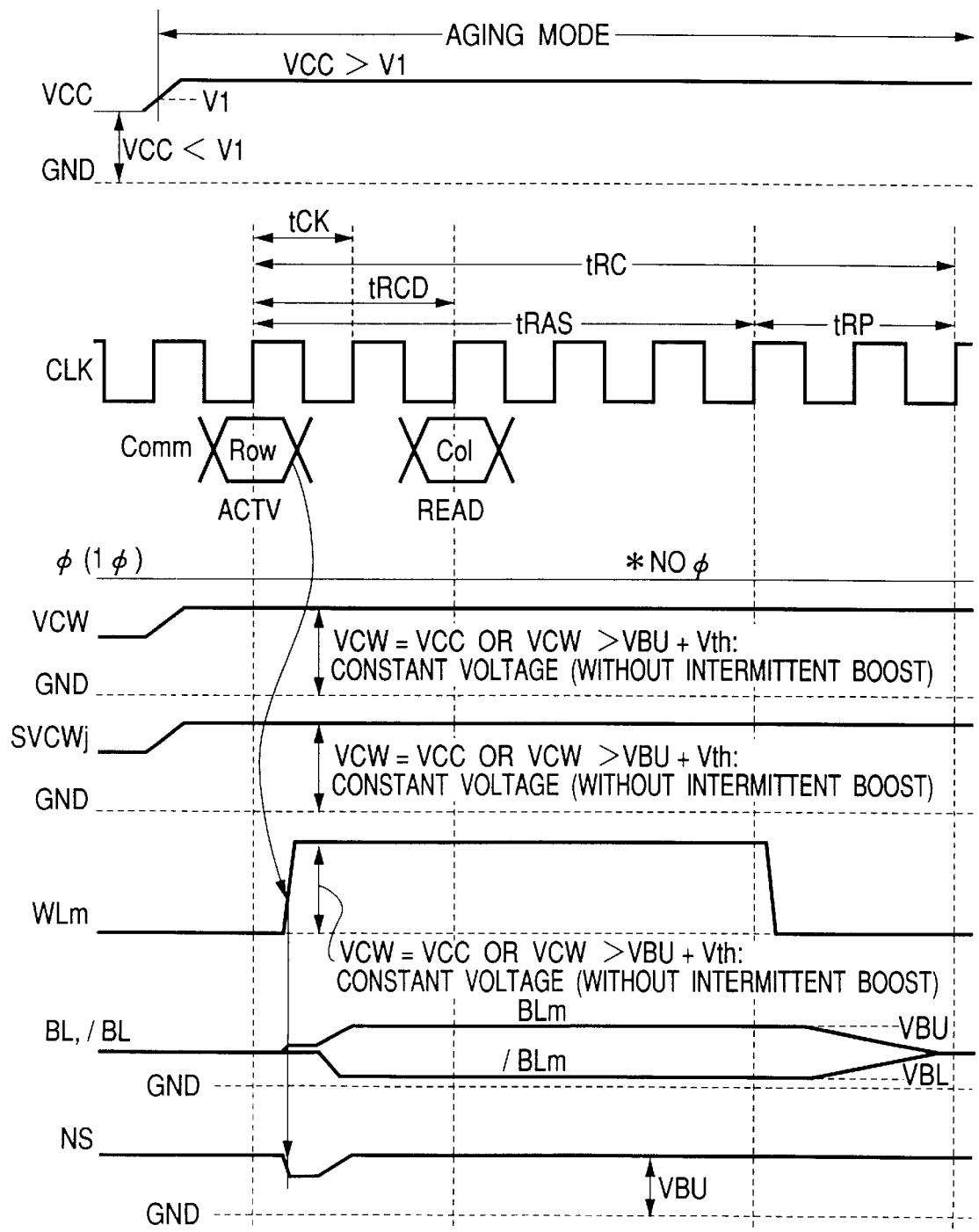
FIG. 25 is a timing chart for explaining an aging mode of the SDRAM according to the invention.

FIG. 25 is a timing chart for explaining an aging mode of the SDRAM according to the invention. This aging mode is established by setting the power supply voltage VCC to a high voltage not less than the discrimination voltage V1. In this aging mode, the generation of the pulse φ or 1φ for activating the word line booster is interrupted, so that the activation voltage VCW of the word line selector is either equalized to the power supply voltage VCC or set at such a voltage, e.g., VBU+Vth which changes in accordance with the high level VBU. Accordingly, the select level of the word line WLm is also raised to VCC or VBU+Vth so that an efficient aging action is performed. FIG. 25 shows the read action by way of example. Although the timing chart for the write action is omitted, the select action of the word lines is similar to that of the aforementioned read action, and the levels of the bit lines BLm and /BLm change according to the write signal.

Figure 26:
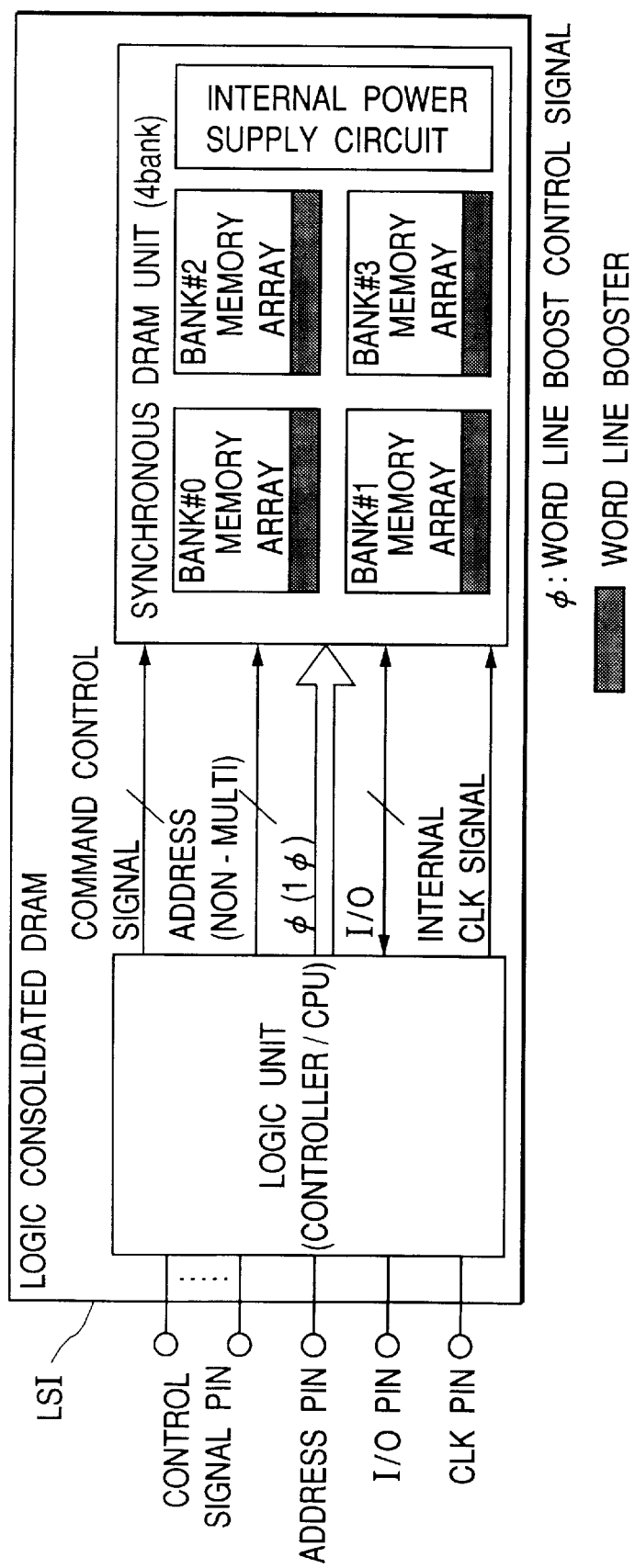
FIG. 26 is a block diagram showing another embodiment of the SDRAM of the invention.

FIG. 26 is a block diagram showing another embodiment of the SDRAM of the invention. The SDRAM of FIG. 26 is mounted together with the logic unit over one semiconductor integrated circuit device LSI. The logic unit is constructed of a memory controller or a CPU (microprocessor), although the invention is not especially limited thereto. The SDRAM of this embodiment is given not the aforementioned two-bank structure, but is given a four-bank structure and is equipped with the aforementioned various internal power supply circuits. The memory array constituting each memory bank is divided into mats, as described hereinbefore, each of which is equipped with the word line booster.

The SDRAM of this embodiment performs memory access through the logic unit or CPU functioning as the aforementioned memory controller. Consequently the input/output interface comprises a control signal pin, an address pin, an I/O (input/output) pin and a CLK pin. The logic unit generates the pulse φ or 1φ in response to the command for the SDRAM and in synchronism with the internal CLK signal. In this structure, there can be omitted from the SDRAM itself the combinational logic circuit for generating the pulse φ or 1φ. Thus, the SDRAM itself may be a memory device constructed of one semiconductor integrated circuit device, or a one-chip memory system, as described above, or may be mounted over the one-chip microcomputer.

Figure 27:
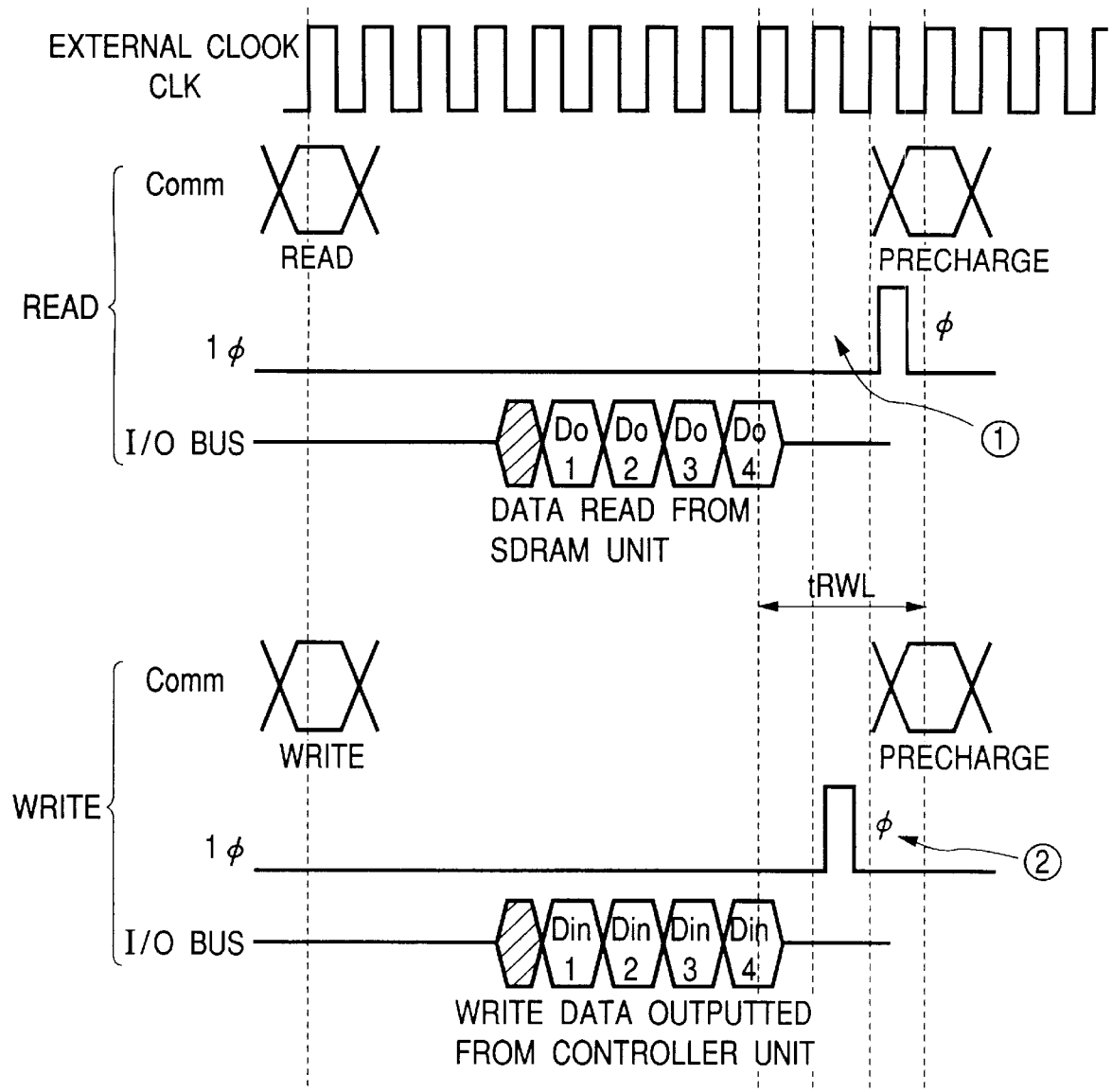
FIG. 27 is a timing chart for explaining the actions of the SDRAM of FIG. 26.

FIG. 27 is a timing chart for explaining the action of the SDRAM of FIG. 26. FIG. 27 shows the read mode and the write mode. In the read mode, it is judged in cycle ① that all data are fetched from the SDRAM by the controller, and the pulse 1φ is generated at that timing to execute the rewrite action of the memory cells. In the write mode, the pulse 1φ is generated to execute the full write action of the memory cells, when all the write data are outputted in cycle ② to the SDRAM by the controller. A precharge command is issued after this rewrite or full write action.

Figure 28:
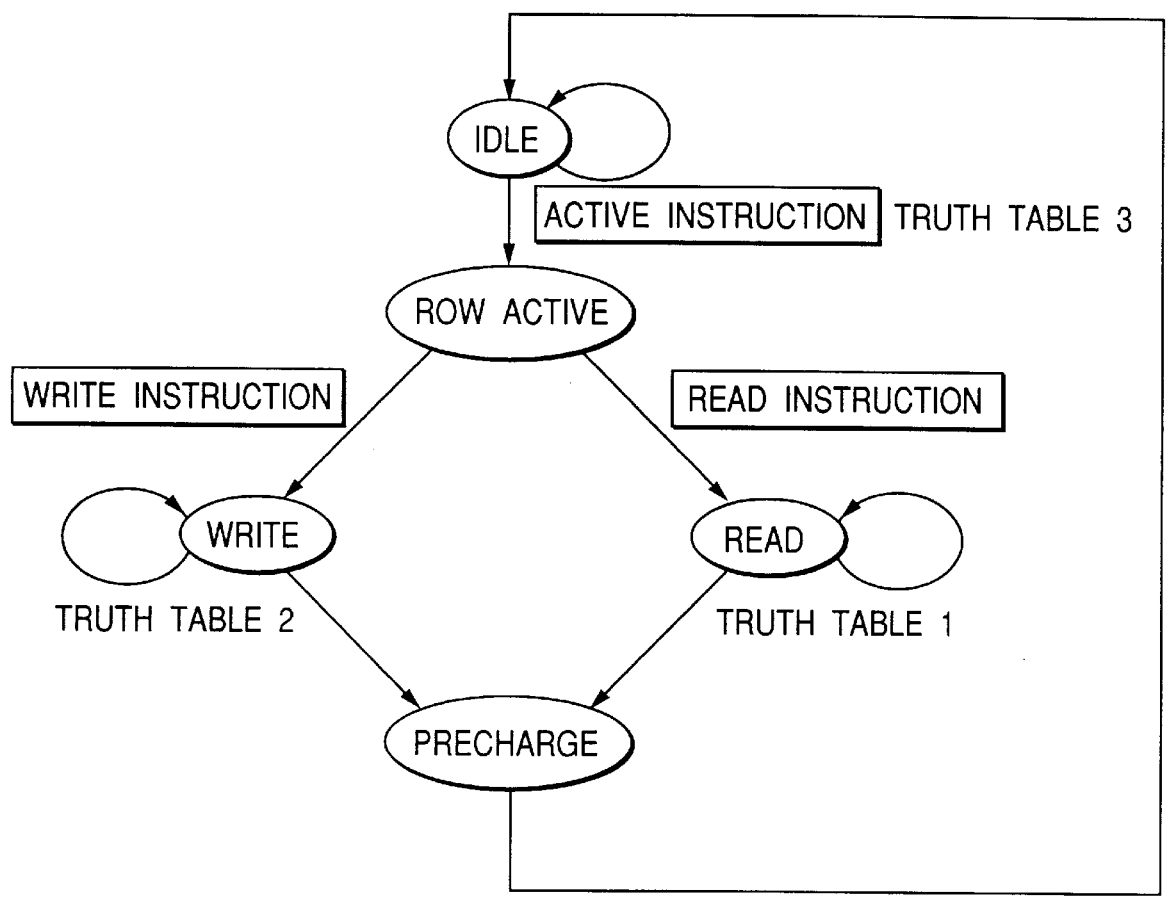
FIG. 28 is a status transition diagram for explaining the actions of a combinational logic circuit and a word line boost control signal generator in FIGS. 11 to 13.

FIG. 28 is a status transition diagram for explaining the actions of a combinational logic circuit and a word line boost control signal generator in the embodiment of FIGS. 11 to 13. In the status transition diagram of FIG. 28, there are shown the transitions of the individual statuses of an active instruction, a write instruction, a read instruction, a precharge and an idling. These read, write and active instructions are executed according to the following Truth Tables 1 to 3.

Table 1 shows the case of when Burst Length BL=4 and CAS Latency CL=2.

TABLE 1

| CLKn | /CS | /RAS | /CAS | /WE | I/O | I φ | Internal Status |
|---|---|---|---|---|---|---|---|
| 1 | L | H | L | H | Hi-Z | L | Read |
| 2 | H | X | X | X | Output | L | Read |
| 3 | H | X | X | X | Output | L | Read |
| 4 | H | X | X | X | Output | H | Read |
| 5 | H | X | X | X | Output | L | Precharge |
| 6 | H | X | X | X | Hi-Z | L | Precharge |
| 7 | H | X | X | X | Hi-Z | L | Precharge |

Table 3 shows the case of when Burst Length BL=4 and CAS Latency CL=2, as in Table 1.

TABLE 3

| CLKn | /CS | /RAS | /CAS | /WE | I/O | I φ | Internal Status |
|---|---|---|---|---|---|---|---|
| 1 | L | L | H | H | Hi-Z | L | Row Active |
| 2 | H | X | X | X | Hi-Z | L | Row Active |
| 3 | H | X | X | X | Hi-Z | L | Row Active |

Table 2 shows the case of when Burst Length BL=4 and tRWL=2. The symbol tRWL designates a final data input precharge read time. In short, when BL=4 and RWL=2 as in the above case, the pulse 1φ is generated at the fifth cycle, because BL+tRL−1=4+2−1=5.

TABLE 2

| CLKn | /CS | /RAS | /CAS | /WE | I/O | I φ | Internal Status |
|---|---|---|---|---|---|---|---|
| 1 | L | H | L | H | Input | L | Write |
| 2 | H | X | X | X | Input | L | Write |
| 3 | H | X | X | X | Input | L | Write |
| 4 | H | X | X | X | Input | L | Write |
| 5 | H | X | X | X | Hi-Z | H | Write |
| 6 | H | X | X | X | Hi-Z | L | Precharge |
| 7 | H | X | X | X | Hi-Z | L | Precharge |

Thus, the timing for activating the word line booster can be determined from the command designating the action mode. Unlike the dynamic RAM of the prior art, more specifically, the end of the memory cycle is not judged after the reset from the low to high levels of the /RAS. It is, however, possible to judge in what cycle from the input of the command the word line should be boosted. This makes it possible to rewrite or fully write the memory cells before the transition to the precharge action.

In the dynamic RAM, there is a tendency for the action voltage VCC to get lower and lower. A study has also been conducted in which the power supply voltage VCC is lowered to a level lower than 3.3 V, such as a level of 2.5 V to 2 V. If the power supply voltage VCC is thus lowered, the threshold voltage Vth of the MOSFET is relatively raised. In other words, for the bootstrap circuit the boosted voltage is determined depending on the capacitance ratio of the load capacitance of the word line to the bootstrap capacitance. As the power supply voltage VCC is thus lowered, the charge stored in advance in the bootstrap capacitor is reduced to lower the boosting efficiency.

When the high level of the bit line is made equal to a voltage corresponding to the power supply voltage, therefore, the aforementioned select level of the word line has to be boosted by the threshold voltage Vth of the address select MOSFET with respect to the power supply voltage. Even if, however, the boost capacitor is precharged to the power supply voltage VCC, for example, the capacity of the boost capacitor has to be larger than the load capacity of the word line so that a voltage as high as the potential of 3.2 V of the word line may be set with the power supply voltage VCC as low as about 2 V by the sincgle boosting action. This requires an impractically large circuit area.

By the charge pump circuit, therefore, there has to be generated a high voltage VCH which is boosted by the threshold voltage Vth of the MOSFET with respect to the power supply voltage VCC, so that the word line driver may be activated by using the high voltage VCH as the power supply voltage. However, this type which generates the boosted voltage VCH by the charge pump circuit deteriorates the efficiency of the charge pump circuit, so that it consumes a relatively large current for its own action. Moreover, when the select level of the word line is made equal to the boosted voltage VCH, the charge-up and the discharge of the parasitic capacitor of the word line are carried out by such a high voltage VCH, increasing the current consumption, and taking a long time to perform the resetting from a voltage as high as the VCH to a level as low as the ground potential. Hence the precharge action is accordingly delayed.

In accordance with the invention, where the internal voltage VCW is generated by the charge pump circuit and the word line selector is activated, therefore, a boosted voltage ΔVB can be made lower than -the threshold voltage Vth if the voltage VCW is made higher than the power supply voltage VCC or the high level VBU of the bit line and lower than the-high level (VBU)+Vth of the bit line. In short, the word line booster can be constructed by using the relatively low power supply voltage VCC and the relatively small boost capacitor. In this construction, there is achieved an effect that the voltage conversion efficiency of the charge pump circuit for generating the voltage VCW can be enhanced. Since the boosted voltage of the word line returns, when the boost action ends, to the boost capacitor, and no current is consumed, there is achieved another effect that it is possible to reduce the current consumed in charging/precharging the word line and to speed up the resetting action of the word line.

This means that the word line booster according to the invention can be applied to not only a SDRAM but also to an ordinary dynamic RAN. In the latter application, the word line booster is not fed, as in the SDRAM, with the clock signal CLK, and the boost action may be ended and changed to the precharge action by starting the bootstrap circuit with the signal delayed from the select timing signal of the word line, to end the boosting action by resetting the /RAS signal to the high level.

The following effects can be achieved from the embodiments thus far described.

(1) For a word line selector for setting word lines connected with dynamic memory cells at a select level corresponding to a first voltage and a nonselect level corresponding to a second voltage, there is provided a bootstrap circuit for raising the potential of the word line set at a select level corresponding to the first voltage, to a high voltage which is given a difference substantially equal to the threshold voltage of address select MOSFETs from the high level of bit lines connected with the memory cells, and the bootstrap circuit is activated in synchronism with a clock signal at a timing corresponding to an action mode designated by a command in an SDRAM before a precharge action, thereby changing the select level of the word lines from the first voltage to the bootstrap voltage. As a result, the time taken to apply the highest field intensity to the word line can be shortened without prolonging the precharge period.

(2) The memory array is divided into a plurality of memory mats, and the word line selectors are provided for the respective memory mats. The bootstrap circuits are provided for the respective word line selectors, and the clock signal is fed to only the bootstrap circuit of the selected memory mat. As a result, the boosting action can be highly efficiently performed at a high speed.

(3) The action voltage of the word line driver of the word line selector is generated by the bootstrap circuit. As a result, the word line driver can be realized by a simple circuit without complicating itself.

(4) The first voltage is generated by the charge pump circuit whose action is controlled intermittently to obtain a desired constant voltage with respect to a power supply voltage fed from an external terminal by receiving the supply voltage and a pulse signal generated in the inside, so that an arbitrary voltage is generated. As a result, the degree of freedom of the design can be enhanced.

(5) The first and third voltages are generated as an identical voltage generated a common voltage generator, and both the second voltage and the fourth voltage are made the ground potential of the circuit. As a result, the power supply circuit can be simplified.

(6) By setting the first voltage at a higher level than the power supply voltage Fat the lower limit, the boost voltage ΔVB of the word line can be lowered even when the power supply voltage VCC is low. As a result, the bootstrap circuit can be constructed in a relatively small circuit scale.

(7) The first voltage and the third voltage are made the power supply voltage fed from the external terminal. As a result, the action is speeded up while preventing the aging breakdown of the gate oxide film by the simple power supply circuit.

(8) The first voltage is made a voltage which changes following up the power supply voltage in the burn-in mode. As a result, an efficient burn-in (aging) can be executed.

(9) For a word line selector for setting word lines connected with dynamic memory cells at a select level corresponding to a first voltage and a nonselect level corresponding to a second voltage, there is provided a bootstrap circuit for raising the potential of the word line set at a select level corresponding to the first voltage, to a high voltage which is given a difference substantially equal to the threshold voltage of address select MOSFETs from the high level of bit lines connected with the memory cells; the first voltage is generated by the-charge pump circuit whose action is controlled intermittently to obtain a desired constant voltage with respect to a power supply voltage fed from the external terminal by receiving the supply voltage and a pulse signal generated in the inside; and the first voltage is set at a higher level than the power supply voltage at the lower limit. As a result, the boosted voltage of the word line can be achieved even at a low power supply voltage by the bootstrap circuit having a small circuit scale.

Although our invention has been specifically described in connection with various embodiments, it should not be limited thereto, but can naturally be modified in various manners without departing from the gist thereof. In the SDRAM of FIG. 1, for example, the number of banks may be either two or four as in the embodiment of FIG. 25. The memory cell may be given a COB (Capacitor On Bit line) structure in which the memory capacitor is on the bit line, so as to prevent any coupling noise which might otherwise be caused by the power supply or the signal bus. In this structure, the bit line is kept away by the shielding effect of the plate from such detrimental influences which might otherwise be caused by the capacitative coupling noises either from the power supply line or Y-select line composed of a third metal layer M3 arranged over the memory cell or from the main word line composed of a second metal layer M2, and can act stably.

The circuit for generating the pulse $\phi$ or $1\phi$ to activate the word line booster (the bootstrap circuit) can take a variety of modes. In the read mode the one-cycle period after the start of the action of the sense amplifier can be used, and the write mode may be effected immediately after the input of the write data. For the burst write mode, the boosting actions are made a plurality of times, but the time period for the highest field intensity to be applied to the word line can still be shortened. In this case, no logic circuit is required to recognize the burst length BL or the final data input precharge read time tRWL, thereby simplifying the circuit. The invention can be widely applied to an SDRAM or DRAM, which may be formed together with another logic circuit over one semiconductor integrated circuit device.

The effect achieved by a representative feature of the invention disclosed herein will be briefly described in the following. For a word line selector for setting word lines connected with dynamic memory cells at a select level corresponding to a first voltage and a nonselect level corresponding to a second voltage, there is provided a bootstrap circuit for raising the potential of the word line set at a select level corresponding to the first voltage, to a high voltage which is given a difference substantially equal to the threshold voltage of address select MOSFETs from the high level of the bit lines connected with the memory cells, and the bootstrap circuit is activated in synchronism with a clock signal at a timing corresponding to an action mode designated by a command in an SDRAM before a precharge action, thereby changing the select level of the word lines from the first voltage to the bootstrap voltage. As a result, the time period taken to apply the highest field intensity to the word line can be shortened without prolonging the precharge period.

We claim:

1. A dynamic RAM comprising:
   a pair of complementary bit lines;
   a word line;
   a dynamic memory cell disposed at the intersection of one of said paired complementary bit lines and said word line;
   a first circuit which supplies said word line with a select level corresponding to a first voltage and a nonselect level corresponding to a second voltage;
   a sense amplifier which receives a potential difference between a signal voltage read out from said dynamic memory cell to said one bit line and a precharge voltage of the other bit line, amplifies said potential difference, and thereby generates a high level corresponding to a third voltage and a low level corresponding to a fourth voltage;
   an output terminal which outputs a read signal based on said high and low levels generated by said sense amplifier;
   a second circuit which boosts the potential of a selected word line from said first voltage to a fifth voltage; and
   a third circuit which is controlled by a command designated by a control signal inputted in synchronism with a clock signal, which outputs said read signal in synchronism with said clock signal,
   wherein said second circuit acts, in synchronism with said clock signal, to boost the select level of said word line intermittently from said first voltage to said fifth voltage.

2. A dynamic RAM according to claim 1,
   wherein said dynamic memory cell includes an information storing capacitor and a MOSFET,
   wherein said MOSFET includes a gate connected to said word line, and a source-drain path connected between the storage node of said information storing capacitor and one of said paired complementary bit lines, and
   wherein said fifth voltage is higher than said third voltage by a difference which is substantially equal to the threshold voltage of said MOSFET.

3. A dynamic RAM according to claim 1,
   wherein said second circuit includes a bootstrap circuit which generates said fifth voltage.

4. A dynamic RAM according to claim 3,
   wherein said first circuit includes a booster which boosts an external power supply voltage to generate said first voltage.

5. A dynamic RAM according to claim 3,
   wherein said first circuit includes a voltage regulator which generates said first voltage on the basis of an external power supply voltage.

6. A dynamic RAM according to claim 5,
   wherein said first circuit includes a charge pump circuit which acts while receiving periodic pulses.

7. A dynamic RAM according to claim 3,
   wherein said dynamic RAM is divided into a plurality of memory mats, and wherein said dynamic RAM includes two or more of said first circuits,
   wherein said bootstrap circuit is provided for each of said first circuits, and
   wherein said clock signal is selectively fed to the bootstrap circuit corresponding to a selected one of said memory mats.

8. A dynamic RAM comprising:
   a pair of complementary bit lines;
   a word line;
   a dynamic memory cell disposed at the intersection of one of said paired complementary bit lines and said word line;
   a first circuit which supplies said word line with a select level corresponding to a first voltage and a nonselect level corresponding to a second voltage;
   a sense amplifier which receives a potential difference between a signal voltage read out from said dynamic memory cell to said one bit line and a precharge voltage of the other bit line, amplifies said potential difference, and thereby generates a high level corresponding to a third voltage and a low level corresponding to a fourth voltage;
   an output terminal which outputs a read signal based on said high and low levels generated by said sense amplifier;
   a second circuit which boosts the potential of a selected word line from said first voltage to a fifth voltage; and
   a third circuit which is controlled by a command designated by an external control signal judged in synchronism with a clock signal, which outputs said read signal in synchronism with said clock signal,
   wherein at a timing before the precharge action of said paired complementary bit lines, said second circuit is activated in synchronism with said clock signal, and the select level of said word line is boosted from said first voltage to said fifth voltage.

9. A dynamic RAM according to claim 8, wherein said dynamic memory cell includes an information storing capacitor and a MOSFET, wherein said MOSFET includes a gate connected to said word line, and a source-drain path connected between the storage node of said information storing capacitor and one of said paired complementary bit lines, and wherein said fifth voltage is higher than said third voltage, and a difference is substantially equal to the threshold voltage of said MOSFET.

10. A dynamic RAM according to claim 8, wherein said second circuit includes a bootstrap circuit which generates said fifth voltage.

11. A dynamic RAM according to claim 10, wherein said first circuit includes a booster which boosts an external power supply voltage to generate said first voltage.

12. A dynamic RAM according to claim 10, wherein said first circuit includes a voltage regulator which generates said first voltage on the basis of an external power supply voltage.

13. A dynamic RAM according to claim 12, wherein said first voltage is generated by a charge pump circuit which receives said external power supply voltage and a pulse signal, and intermittently controlled to obtain a desired constant voltage with respect to said power supply voltage.

14. A dynamic RAM according to claim 13, wherein said first voltage is substantially equal to said third voltage, and wherein said second voltage is at a ground potential.

15. A dynamic RAM according to claim 10, wherein said first voltage and said third voltage are a power supply voltage fed from an external terminal.

16. A dynamic RAM according to claim 12, wherein said first voltage is changing in correspondence with said external power supply voltage in a burn-in mode.

17. A dynamic RAM comprising:

a pair of complementary bit lines;

a word line;

a dynamic memory cell disposed at the intersection of one of said paired complementary bit lines and said word line, wherein said dynamic memory cell includes an information storing capacitor and a MOSFET, and wherein said MOSFET includes a gate connected to said word line, and a source-drain path connected between the storage node of said information storing capacitor and one of said paired complementary bit lines;

a word line driver which supplies said word line with a select level corresponding to a first voltage and a nonselect level corresponding to a second voltage;

a sense amplifier which receives a potential difference between a signal voltage generated by charge sharing between the precharge of said one bit line and the stored charge of said dynamic memory cell and read out to said one bit line, and a precharge voltage of the other bit line, amplifies said potential difference, and thereby generates a high level corresponding to a third voltage or a low level corresponding to a fourth voltage; and a bootstrap circuit which sets the potential of a selected word line set at the level of said first voltage, to a high voltage which is given a difference substantially equal to the threshold voltage of said MOSFET with respect to said third voltage, wherein said first voltage is generated by a charge pump circuit which receives an external power supply voltage fed from an external terminal and an internal pulse signal, wherein said charge pump circuit is intermittently controlled to obtain a desired constant voltage with respect to said supply voltage.

18. A dynamic RAM according to claim 17, wherein said first voltage is a voltage higher than said external power supply voltage.

19. A dynamic RAM according to claim 17, wherein in a burn-in mode, said first voltage changes depending on said external power supply voltage.

20. A dynamic RAM comprising:

a dynamic memory cell including an address selecting MOSFET having a gate connected to a word line, a source and a drain, one of which is connected to one of complementary bit lines intersecting said word line, and the other of which is connected to a storage node of an information storing capacitor;

a word line driver which feeds to said word line a select level corresponding to a first voltage and a nonselect level corresponding to a second voltage;

a sense amplifier which receives a potential difference between a signal voltage generated by charge sharing between the precharge of said one bit line and the storage charge of said dynamic memory cell and read out to said one bit line, and a precharge voltage of the other bit line, amplifies said potential difference, and thereby generates a high level corresponding to a third voltage or a low level corresponding to a fourth voltage;

an output terminal which outputs a read signal based on said high and low levels generated by said sense amplifier;

a bootstrap circuit which sets the potential of a selected word line set at the level of said first voltage, to a high voltage which is given a difference substantially equal to the threshold voltage of said address selecting MOSFET with respect to said third voltage; and a circuit controlled by a control signal inputted in synchronism with a clock signal, for outputting a write signal or said read signal in synchronism with said clock signal, wherein said bootstrap circuit is activated in synchronism with said clock signal, thereby changing the select level of said word line intermittently from said first voltage to a bootstrap voltage.

21. A dynamic RAM according to claim 20, wherein said dynamic RAM is divided into a plurality of memory mats, and wherein said dynamic RAM includes two or more of said word line drivers, wherein a plurality of said bootstrap circuits are provided for said word line drivers, and wherein said clock signal is fed only to the bootstrap circuit corresponding to a selected one of said memory mats.

22. A dynamic RAM comprising:

a dynamic memory cell including an address selecting MOSFET having a gate connected to a word line, a source and a drain, one of which is connected to one of complementary bit lines intersecting said word line, and the other of which is connected to a storage node of an information storing capacitor;

a word line driver which feeds to said word line a select level corresponding to a first voltage and a nonselect level corresponding to a second voltage;

a sense amplifier which receives a potential difference between a signal voltage generated by charge sharing between the precharge of said one bit line and the stored charge of said dynamic memory cell and read out to said one bit line, and a precharge voltage of the other bit line, amplifies said potential difference, and thereby generates a high level corresponding to a third voltage or a low level corresponding to a fourth voltage;

an output terminal which outputs a read signal based on said high and low levels generated by said sense amplifier;

a bootstrap circuit which sets the potential of a selected word line set at the level of said first voltage, to a high voltage which is given a difference substantially equal to the threshold voltage of said address selecting MOSFET with respect to said third voltage; and a circuit controlled by a control signal inputted in synchronism with a clock signal, for outputting a write signal or said read signal in synchronism with said clock signal, wherein at a timing corresponding to an operation mode designated by a command and before the precharge operation, said bootstrap circuit is activated in synchronism with said clock signal, thereby changing the select level of said word line from said first voltage to a bootstrap voltage.

23. A dynamic RAM according to claim 22, wherein said dynamic RAM is divided into a plurality of memory mats, and wherein said dynamic RAM includes two or more of said word line drivers, wherein a plurality of said bootstrap circuits are provided for said word line drivers, and wherein said clock signal is fed only to the bootstrap circuit corresponding to a selected one of said memory mat.

24. A dynamic RAM according to claim 22 or 23, wherein said bootstrap circuit generates an action voltage of said word line driver.

25. A dynamic RAM according to claim 22 or 23, wherein said first voltage is generated by a charge pump circuit which receives a power supply voltage fed from an external terminal and a pulse signal and is intermittently controlled to obtain a desired constant voltage with respect to said power supply voltage.

26. A dynamic RAM according to claim 22 or 23, wherein said first voltage and said third voltage are the same voltage generated by a common voltage generator, and wherein both said second voltage and said fourth voltage are the ground potential.

27. A dynamic RAM according to claim 22 or 23, wherein said first voltage is set at a higher voltage than power supply voltage.

28. A dynamic RAM according to claim 22 or 23 wherein said first voltage and said third voltage are the power supply voltage fed from an external terminal.

29. A dynamic RAM according to claim 25 wherein in a burn-in mode, said first voltage changes depending on said external power supply voltage.

30. A dynamic RAM comprising:

a dynamic memory cell including an address selecting MOSFET having a gate connected to a word line, a source and a drain, one of which is connected to one of complementary bit lines intersecting said word line, and the other of which is connected to a storage node of an information storing capacitor;

a word line driver which feeds to said word line a select level corresponding to a first voltage and a nonselect level corresponding to a second voltage;

a sense amplifier which receives a potential difference between a signal voltage generated by charge sharing between the precharge of said one bit line and the stored charge of said dynamic memory cell and read out to said one bit line, and a precharge voltage of the other bit line, amplifies said potential difference, and thereby generates a high level corresponding to a third voltage or a low level corresponding to a fourth voltage; and a bootstrap circuit which sets the potential of a selected word line set at the level of said first voltage, to a high voltage which is given a difference substantially equal to the threshold voltage of said address selecting MOSFET with respect to said third voltage; and wherein said first voltage is generated by a charge pump circuit which receives a power supply voltage fed from an external terminal and an internal pulse signal, wherein said charge pump circuit is intermittently controlled to obtain a desired constant voltage with respect to said supply voltage, and wherein said first voltage is set to a higher voltage than at least the power supply voltage at the lower limit.

* * * * *